US012513926B2

(12) United States Patent
Gejo et al.

(10) Patent No.: US 12,513,926 B2
(45) Date of Patent: Dec. 30, 2025

(54) SEMICONDUCTOR DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki (JP); Tatsunori Sakano, Shinagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 936 days.

(21) Appl. No.: 17/649,817

(22) Filed: Feb. 3, 2022

(65) Prior Publication Data

US 2023/0006057 A1    Jan. 5, 2023

(30) Foreign Application Priority Data

Jul. 1, 2021 (JP) ................................. 2021-109805

(51) Int. Cl.
*H10D 12/00* (2025.01)
*H01L 23/528* (2006.01)
(Continued)

(52) U.S. Cl.
CPC ......... *H10D 12/481* (2025.01); *H01L 23/528* (2013.01); *H10D 12/441* (2025.01); *H10D 62/127* (2025.01); *H10D 64/232* (2025.01)

(58) Field of Classification Search
CPC .. H10D 12/481; H10D 62/127; H10D 64/232; H10D 64/519; H10D 12/441
See application file for complete search history.

(56) References Cited

U.S. PATENT DOCUMENTS 7,952,143 B2    5/2011 Soeno et al.
10,636,786 B2   4/2020 Shinsho
(Continued)

FOREIGN PATENT DOCUMENTS

JP    2005-191221 A    7/2005
JP    2009-272550 A    11/2009
(Continued)

OTHER PUBLICATIONS

Engish Tranlation for JP-2016167539-A, 9 pages (Year: 2016).*
(Continued)

*Primary Examiner* — Phat X Cao
(74) *Attorney, Agent, or Firm* — Oblon, McClelland, Maier & Neustadt, L.L.P.

(57) ABSTRACT

According to one embodiment, a semiconductor device includes first to third electrodes, a first wiring member, a semiconductor member, and an insulating member. The first wiring member includes a first extending portion. A part of the third electrode is between the first electrode and the first extending portion. An other part of the third electrode is between the first and second electrodes. The semiconductor member is provided between the first and second electrodes and between the first electrode and the first extending portion. The semiconductor member includes first to sixth semiconductor regions. The first semiconductor region includes first and second partial regions. The first partial region is located between the first electrode and the third electrode. The insulating member includes the first insulating region. The first insulating region is provided between the third electrode and the semiconductor member.

17 Claims, 20 Drawing Sheets

(51) Int. Cl.
    *H10D 62/10*          (2025.01)
    *H10D 64/23*          (2025.01)

(56) References Cited

U.S. PATENT DOCUMENTS

| | | |
|---|---|---|
| 10,756,181 B1 | 8/2020 | Kawakami et al. |
| 2019/0081162 A1 | 3/2019 | Gejo et al. |
| 2020/0295167 A1* | 9/2020 | Tsubomi ............. H10D 62/107 |

FOREIGN PATENT DOCUMENTS

| | | | | |
|---|---|---|---|---|
| JP | 2016167539 A | * | 9/2016 | ......... H01L 23/3736 |
| JP | 2018-120990 A | | 8/2018 | |
| JP | 2019-054070 A | | 4/2019 | |
| JP | 2020-150031 A | | 9/2020 | |
| JP | 2020-150159 A | | 9/2020 | |

OTHER PUBLICATIONS

Japanese Office Action issued Aug. 16, 2024 in Japanese Patent Application No. 2021-109805 (with unedited computer-generated English translation), 11 pages.

* cited by examiner

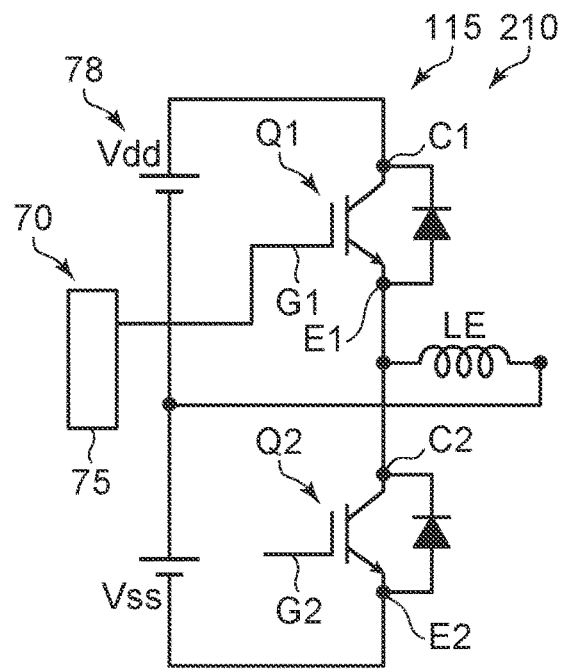
FIG. 11A
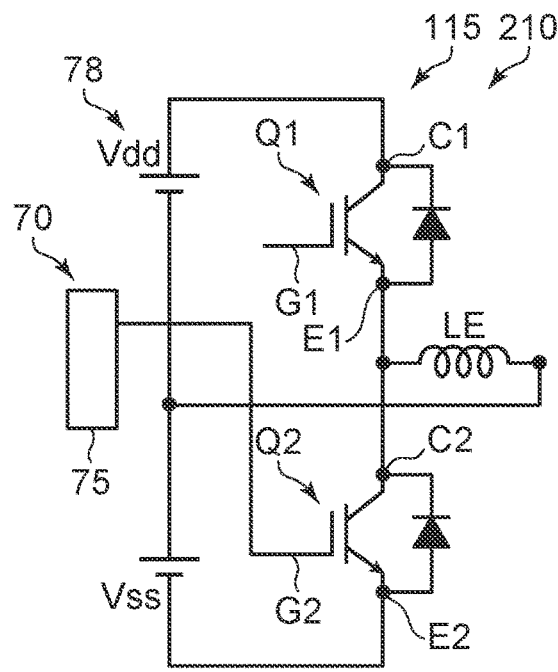
FIG. 11B
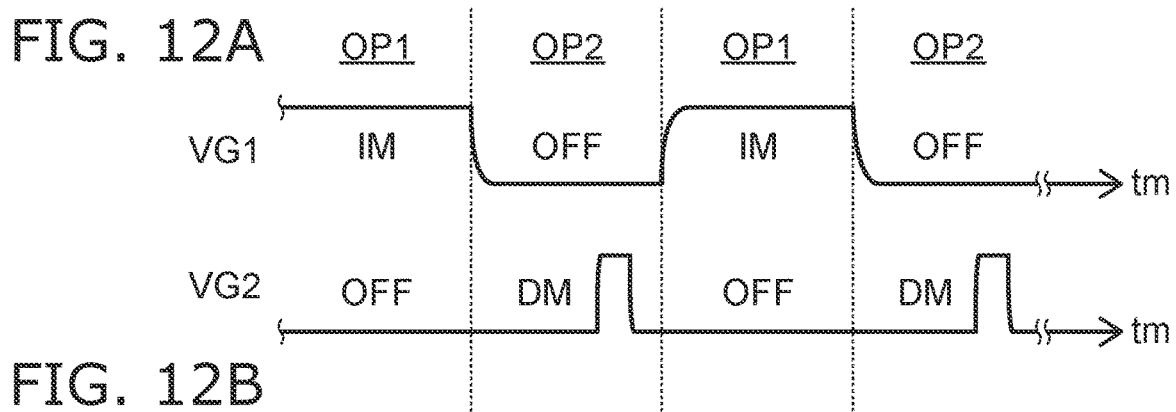
FIG. 12A
FIG. 12B

SEMICONDUCTOR DEVICE AND SEMICONDUCTOR MODULE

CROSS-REFERENCE TO RELATED APPLICATIONS

This application is based upon and claims the benefit of priority from Japanese Patent Application No. 2021-109805, filed on Jul. 1, 2021; the entire contents of which are incorporated herein by reference.

FIELD

Embodiments described herein generally relate to a semiconductor device and a semiconductor module.

BACKGROUND

For example, in a semiconductor device such as a transistor, stable characteristics are desired.

BRIEF DESCRIPTION OF THE DRAWINGS

FIGS. 11A and 11B are circuit diagrams showing a usage example of the semiconductor device according to the first embodiment;

FIGS. 12A and 12B are schematic diagrams showing an example of use of the semiconductor device according to the first embodiment;

DETAILED DESCRIPTION

Figure 1:
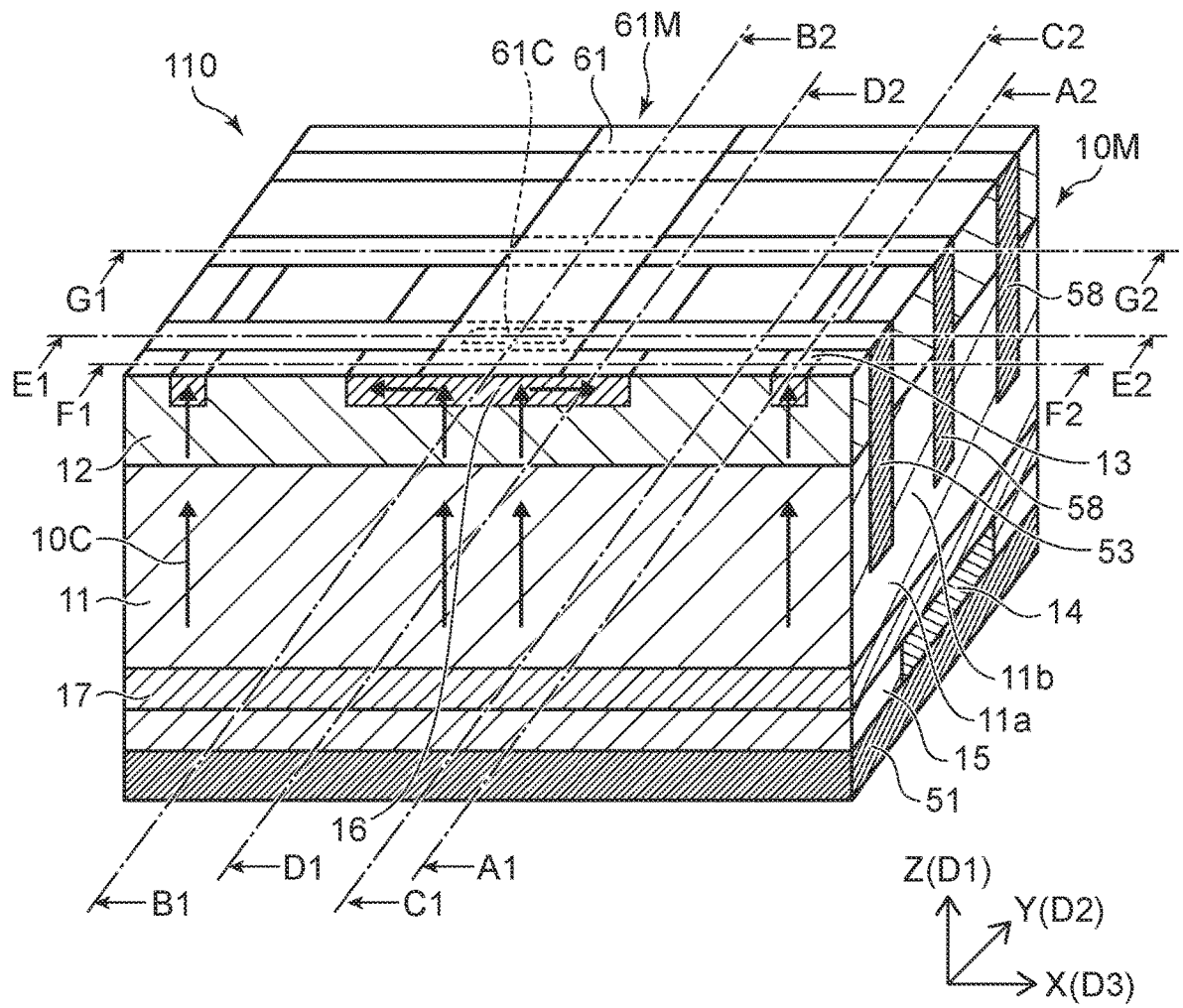
FIG. 1 is a schematic view illustrating a semiconductor device according to the first embodiment.

According to one embodiment, a semiconductor device includes a first electrode, a second electrode, a third electrode, a first wiring member, a semiconductor member, and an insulating member. A direction from the first electrode to the second electrode is along a first direction. The first wiring member includes a first extending portion. The first extending portion extends along a second direction crossing the first direction. A third direction from the first extending portion to the second electrode crosses a first plane including the first direction and the second direction. The third electrode extends along the third direction. A part of the third electrode is located between the first electrode and the first extending portion. An other part of the third electrode is located between the first electrode and the second electrode. The third electrode is electrically connected with the first extending portion. The semiconductor member is provided between the first electrode and the second electrode and between the first electrode and the first extending portion in the first direction. The semiconductor member includes first to sixth semiconductor regions. The first semiconductor region is of a first conductive type. The first semiconductor region includes a first partial region and a second partial region. The first partial region is located between the first electrode and the third electrode in the first direction. A direction from the third electrode to the second partial region is along the second direction. The second semiconductor region is of a second conductive type and electrically connected with the second electrode. A direction from the third electrode to the second semiconductor region is along the second direction. The third semiconductor region is of first conductive type electrically connected with the second electrode. A part of the second semiconductor region is located between the second partial region and the third semiconductor region in the first direction. A direction from the third electrode to at least a part of the third semiconductor region is along the second direction. The fourth semiconductor region is of the second conductive type provided between the first electrode and the first semiconductor region. The fifth semiconductor region is of the first conductive type provided between the first electrode and the first semiconductor region. A direction from the fourth semiconductor region to the fifth semiconductor region crosses the first direction. The sixth semiconductor region is of the first conductive type electrically connected with the second electrode. At least a part of the sixth semiconductor region is between an other part of the second semiconductor region and the first extending portion. The insulating member includes the first insulating region. The first insulating region is provided between the third electrode and the semiconductor member.

According to one embodiment, a semiconductor device includes a first electrode, a second electrode, a third electrode, a fourth electrode, a first wiring member, a second wiring member, a semiconductor member, and an insulating member. A direction from the first electrode to the second electrode is along a first direction. The first wiring member includes a first extending portion. The first extending portion extends along a second direction crossing the first direction. A third direction from the first extending portion to the second electrode crosses a first plane including the first direction and the second direction. The second wiring member includes a second extending portion. The second extending portion extends along the second direction. A direction from the second extending portion to the second electrode is along the third direction. The third electrode extends along the third direction. A part of the third electrode is located between the first electrode and the first extending portion. An other part of the third electrode is located between the first electrode and the second electrode. The third electrode is electrically connected with the first extending portion. The fourth electrode extends along the third direction. A part of the fourth electrode is located between the first electrode and the second extending portion. An other part of the fourth electrode is located between the first electrode and the second electrode. The fourth electrode is electrically connected with the second extending portion. A direction from the third electrode to the fourth electrode is along the second direction. The semiconductor member is provided between the first electrode and the second electrode, between the first electrode and the first extending portion, and between the first electrode and the second extending portion in the first direction. The semiconductor member includes first to sixth semiconductor regions. The first semiconductor region is of a first conductive type. The first semiconductor region includes a first partial region, a second partial region, a third partial region, and a fourth partial region. The first partial region is located between the first electrode and the third electrode in the first direction. A direction from the third electrode to the second partial region is along the second direction. The third partial region is located between the first electrode and the fourth electrode in the first direction. A direction from the fourth electrode to the fourth partial region is along the second direction. The second semiconductor region is of a second conductive type electrically connected with the second electrode. A direction from the third electrode to the second semiconductor region and a direction from the fourth electrode to the second semiconductor region are along the second direction. The third semiconductor region is of first conductive type electrically connected with the second electrode. A part of the second semiconductor region is located between the second partial region and the third semiconductor region in the first direction. A direction from the third electrode to at least a part of the third semiconductor region is along the second direction. The fourth semiconductor region is of the second conductive type provided between the first electrode and the first semiconductor region. The fifth semiconductor region is of the first conductive type provided between the first electrode and the first semiconductor region. A direction from the fourth semiconductor region to the fifth semiconductor region crosses the first direction. The sixth semiconductor region is of the first conductive type electrically connected with the second electrode. At least a part of the sixth semiconductor region is between an other part of the second semiconductor region and the first extending portion. At least a part of the insulating member is provided between the third electrode and the semiconductor member, and between the fourth electrode and the semiconductor member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1, 2A, 2B, and 3 to 10 are schematic views illustrating a semiconductor device according to a first embodiment.

Figure 2A:
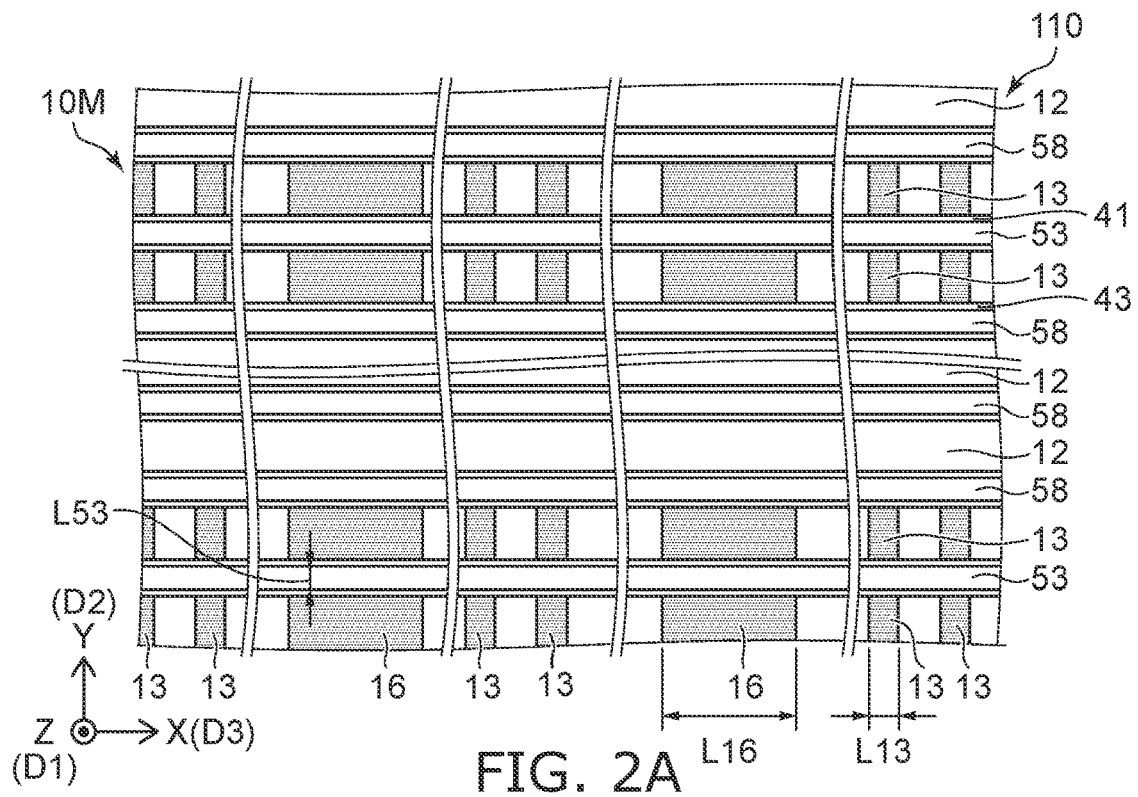
FIGS. 2A and 2B are schematic views illustrating the semiconductor device according to the first embodiment.
Figure 2B:
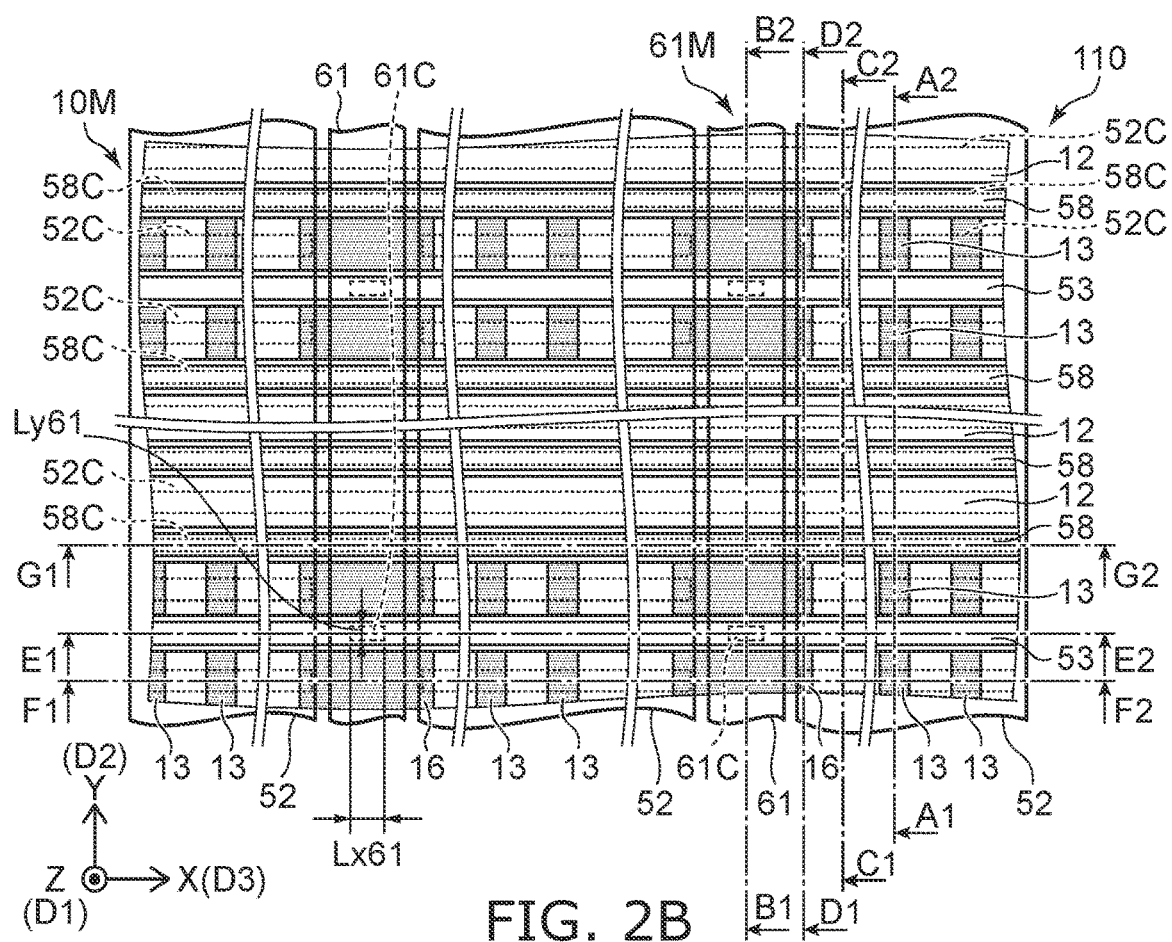
Figure 8:
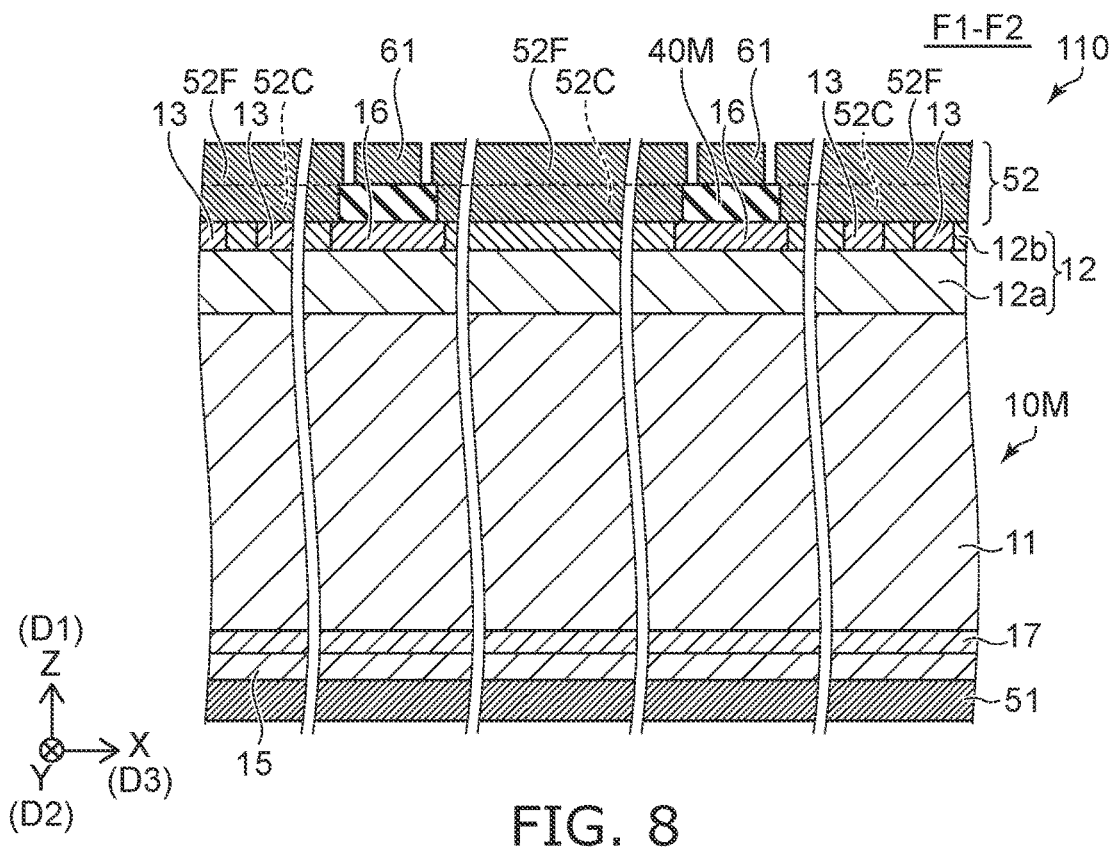
FIG. 8 is a schematic view illustrating the semiconductor device according to the first embodiment.
Figure 9:
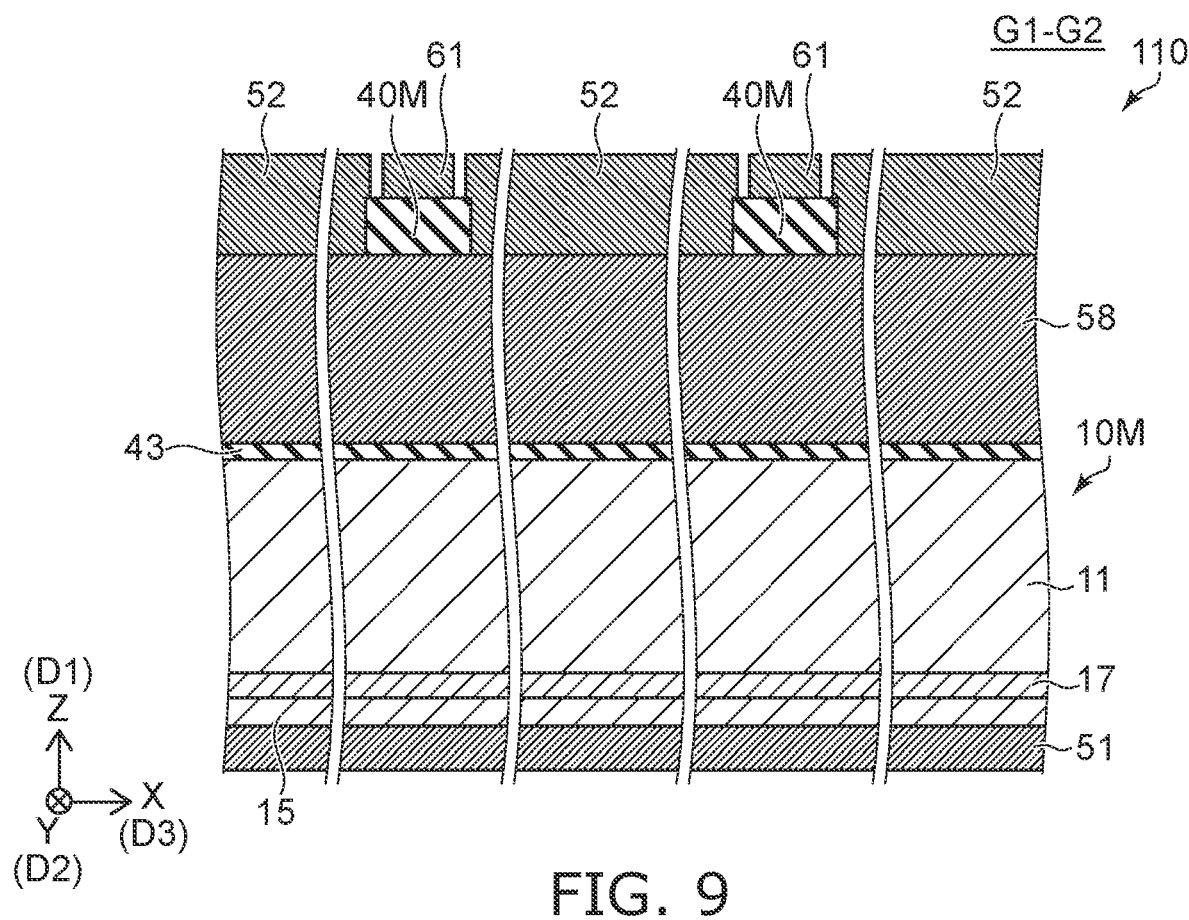
FIG. 9 is a schematic view illustrating the semiconductor device according to the first embodiment.
Figure 10:
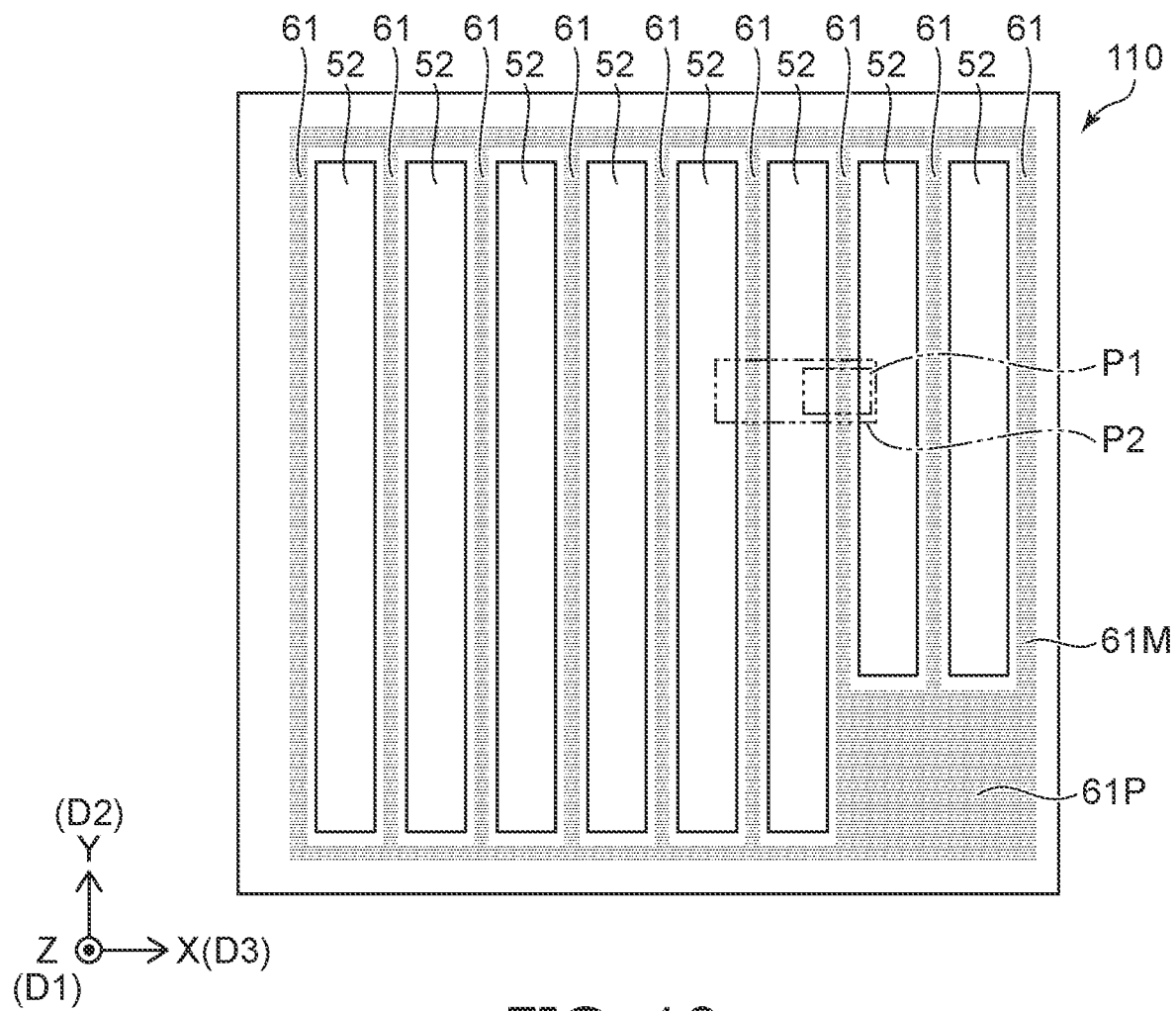
FIG. 10 is a schematic view illustrating the semiconductor device according to the first embodiment.

FIG. 1 is a perspective view illustrating the portion P1 shown in FIG. 10. FIG. 2A is a plan view of the portion P2 shown in FIG. 10. FIG. 2B is a transmission plan view of the portion P2 of FIG. 10. FIGS. 3 to 9 are sectional views corresponds to A1-A2 line, B1-B2 line, C1-C2 line, D1-D2 line, E1-E2 line, F1-F2 line, and G1-G2, respectively, of FIG. 2B. The A1-A2 line, B1-B2 line, C1-C2 line and D1-D2 line in FIG. 1 correspond to each part for the A1-A2 line, B1-B2 line, C1-C2 line and D1-D2 line in FIG. 2B. FIG. 10 is a plan view.

Figure 3:
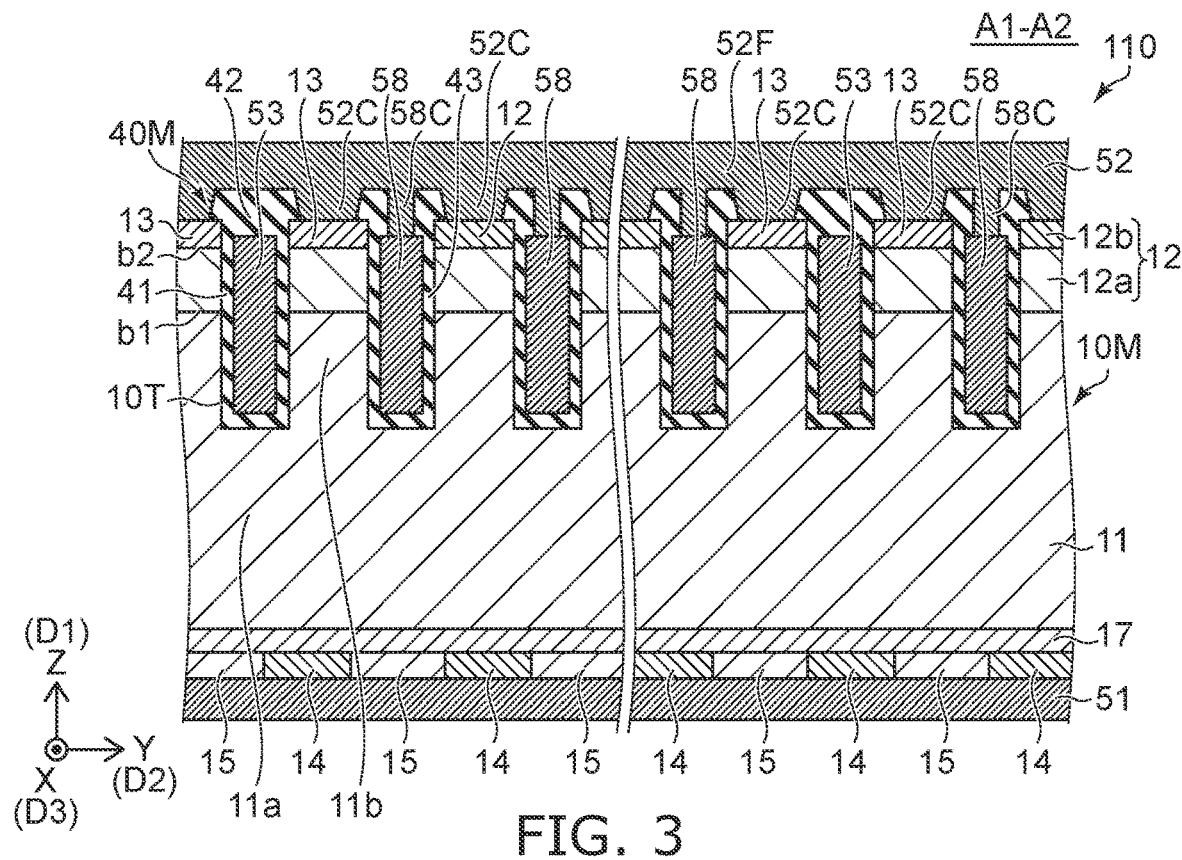
FIG. 3 is a schematic view illustrating the semiconductor device according to the first embodiment.
Figure 4:
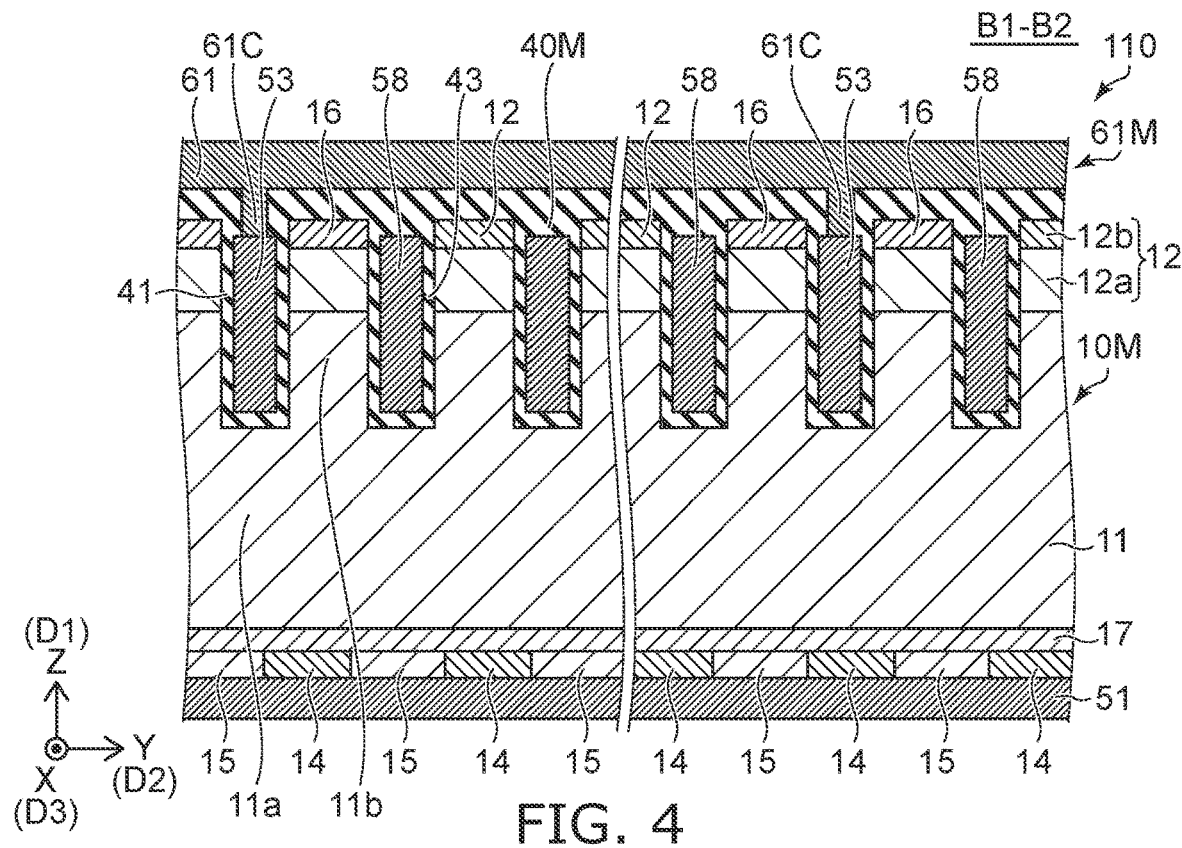
FIG. 4 is a schematic view illustrating the semiconductor device according to the first embodiment.
Figure 5:
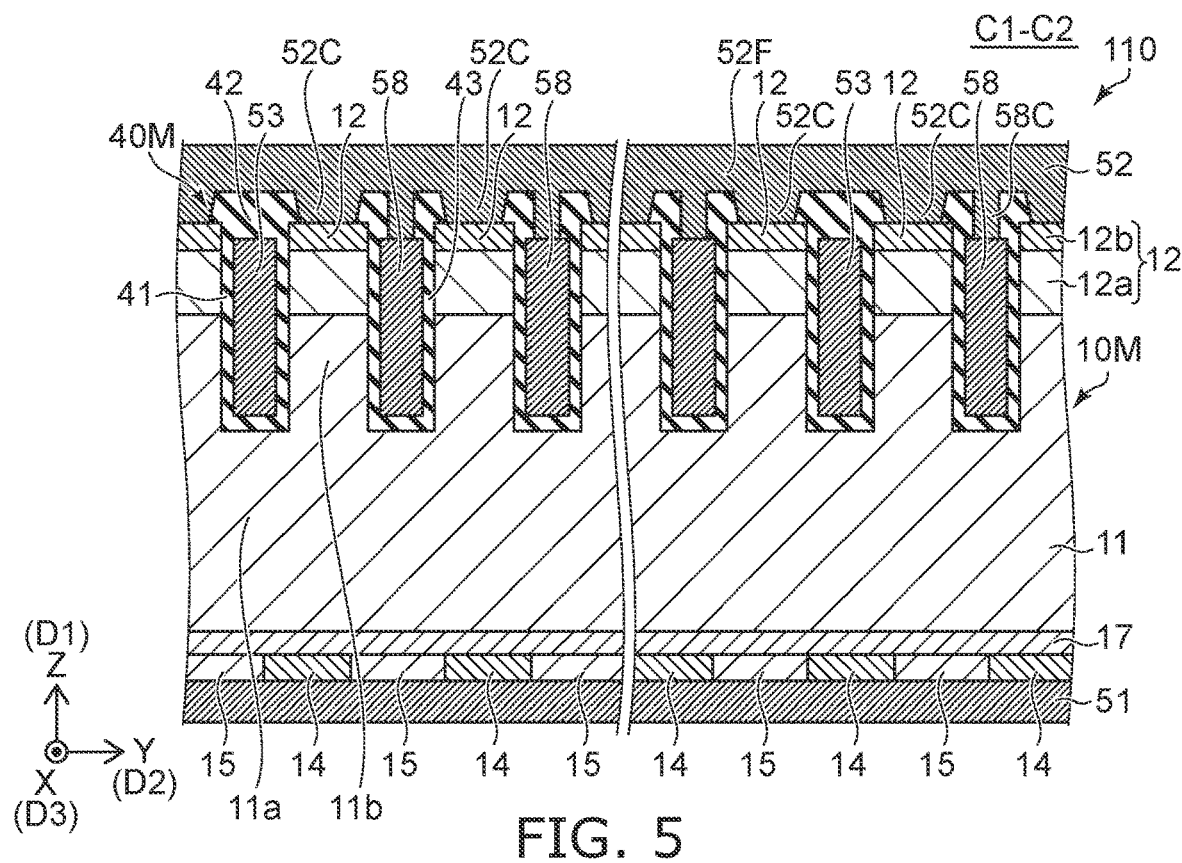
FIG. 5 is a schematic view illustrating the semiconductor device according to the first embodiment.

As shown in FIG. 3, a semiconductor device 110 according to the embodiment includes a first electrode 51. As shown in FIGS. 4 and 10, the semiconductor device 110 includes a second electrode 52 and a first wiring member 61M. As shown in FIGS. 1 and 3, the semiconductor device 110 includes a third electrode 53, the semiconductor member 10M, and an insulating member 40M. In FIG. 1, the second electrode 52 and the insulating member 40M are omitted in order to make the figure easier to see.

As shown in FIG. 3, a direction from the first electrode 51 to the second electrode 52 is along a first direction D1. The first direction is defined as a Z-axis direction. One direction perpendicular to the Z-axis direction is defined as a Y-axis direction. The direction perpendicular to the Z-axis direction and the Y-axis direction is defined as an X-axis direction.

As shown in FIGS. 1 and 2B, the first wiring member 61M includes a first extending portion 61. The first extending portion 61 extends along a second direction D2. The second direction D2 crosses the first direction D1. The second direction D2 is, for example, the Y-axis direction. A length of the first extending portion 61 (the length along the Y-axis direction) is longer than a length of the first extending portion 61 along the X-axis direction.

Figure 7:
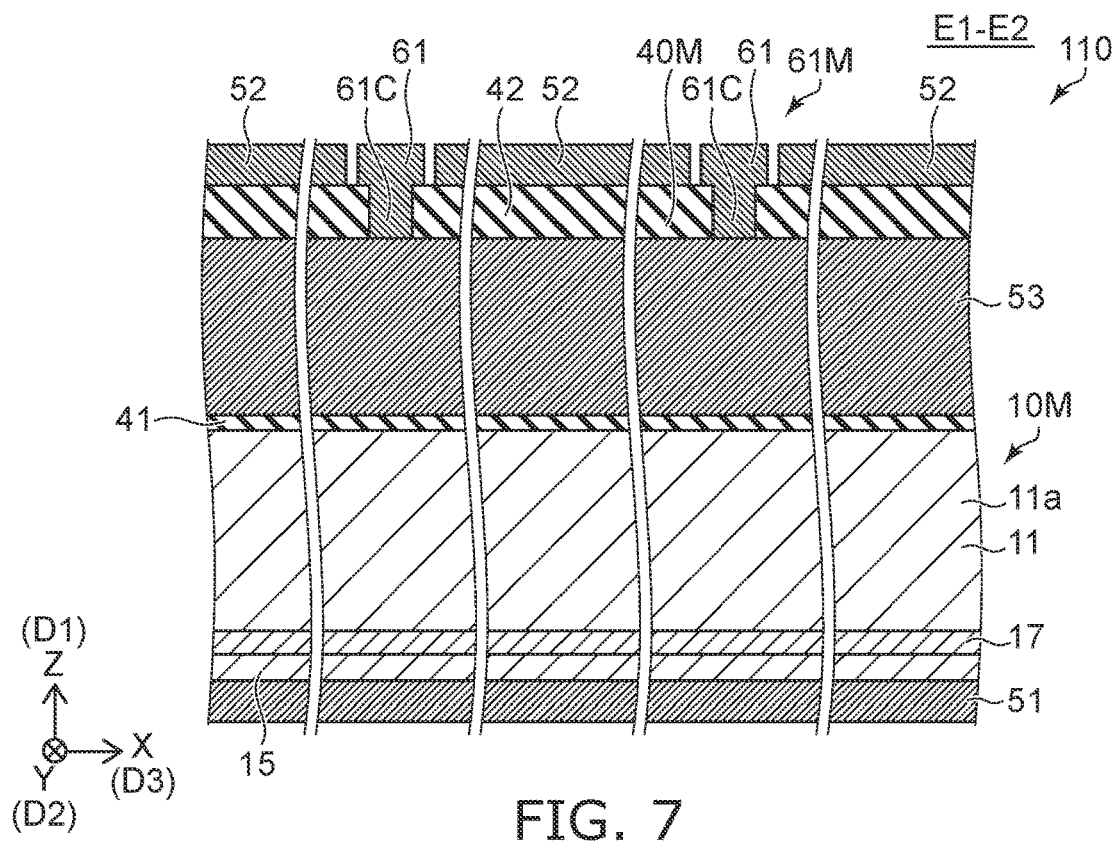
FIG. 7 is a schematic view illustrating the semiconductor device according to the first embodiment.

As shown in FIGS. 2B, 7 and 10, a third direction D3 from the first extending portion 61 to the second electrode 52 crosses a first plane including the first direction D1 and the second direction D2. The first plane is, for example, the Z-Y plane. The third direction D3 may be, for example, the X-axis direction.

In this example, a plurality of second electrodes 52 and a plurality of first extending portions 61 are provided. The "second electrode 52" is one of a plurality of second electrodes 52. The "first extending portion 61" is one of a plurality of first extending portions 61.

FIG. 2A illustrates the semiconductor member 10M and the third electrode 53. As shown in FIG. 2A, the third electrode 53 extends along the third direction D3. A length of the third electrode 53 along the third direction D3 is longer than a length L53 of the third electrode 53 along the second direction D2. In this example, a plurality of third electrodes 53 are provided. The "third electrode 53" is one of a plurality of third electrodes 53.

As shown in FIG. 7, a part of the third electrode 53 is located between the first electrode 51 and the first extending portion 61. A part of the third electrode 53 is located between a first partial region 11a of the first semiconductor region 11 and the first extending portion 61.

As shown in FIG. 7, another part of the third electrode 53 is located between the first electrode 51 and the second electrode 52. Another part of the third electrode 53 is located between the first partial region 11a of the first semiconductor region 11 and the second electrode 52. The third electrode 53 is electrically connected with the first extending portion 61. In this example, the first wiring member 61M includes a first wiring connecting portion 61C. The first wiring connecting portion 61C is provided between the third electrode 53 and the first extending portion 61. The first wiring connecting portion 61C electrically connects the third electrode 53 with the first extension portion 61. The boundary between the first extending portion 61 and the first wiring connecting portion 61C may be clear or unclear. The first extending portion 61 and the first wiring connecting portion 61C may be seamlessly continuous.

As shown in FIG. 7, the semiconductor member 10M is provided between the first electrode 51 and the second electrode 52 and between the first electrode 51 and the first extending portion 61 in the first direction D1. As shown in FIG. 1, the semiconductor member 10M includes first to sixth semiconductor regions 11 to 16.

The first semiconductor region 11 is of a first conductive type. As shown in FIGS. 1 and 3, the first semiconductor region 11 includes a first partial region 11a and a second partial region 11b. The first partial region 11a is located between the first electrode 51 and the third electrode 53 in the first direction D1. A direction from the third electrode 53 to the second partial region 11b is along the second direction D2.

The second semiconductor region 12 is of a second conductive type. The first conductive type is one of n type and p type. The second conductive type is the other of n type and p type. In the following, the first conductive type is n-type and the second conductive type is p-type.

The second semiconductor region 12 is electrically connected with the second electrode 52. As shown in FIG. 8, in this example, the second electrode 52 includes a second electrode planar portion 52F and a second electrode connecting portion 52C. The second electrode planar portion 52F extends along the X-Y plane. As shown in FIG. 2B, the second electrode connecting portion 52C extends along the third direction D3. As shown in FIG. 8, a part of the second electrode connecting portion 52C is located between the second semiconductor region 12 and the second electrode planar portion 52F in the first direction D1. The second electrode connecting portion 52C electrically connects the second semiconductor region 12 with the second electrode planar portion 52F.

As shown in FIG. 8, the second semiconductor region 12 may include a region 12a and a region 12b. A part of the region 12a is provided between the first semiconductor region 11 and the region 12b. Another part of the region 12a is provided between the first semiconductor region 11 and the third semiconductor region 13. The region 12b is provided between the region 12a and the second electrode 52. A concentration of impurity of the second conductive type in the region 12b is higher than a concentration of impurity of the second conductive type in the region 12a. The region 12a is, for example, a p-region. The region 12b is a p$^+$-region. By providing the region 12b, for example, a low contact resistance can be obtained between the second semiconductor region 12 and the second electrode 52.

As shown in FIGS. 1 and 3, a direction from the third electrode 53 to the second semiconductor region 12 is along the second direction D2.

As shown in FIG. 3, the third semiconductor region 13 is electrically connected with the second electrode 52. For example, the third semiconductor region 13 is in contact with the second electrode 52. As shown in FIG. 3, a part of the second semiconductor region 12 is located between the second partial region 11b and the third semiconductor region 13 in the first direction D1. A direction from the third electrode 53 to at least a part of the third semiconductor region 13 is along the second direction D2. For example, a boundary b2 between the second semiconductor region 12 and the third semiconductor region 13 faces the third electrode 53 in the second direction D2. For example, a boundary b1 between the first semiconductor region 11 (second partial region 11b) and the second semiconductor region 12 faces the third electrode 53 in the second direction D2.

As shown in FIGS. 1 and 3, the fourth semiconductor region 14 is provided between the first electrode 51 and the first semiconductor region 11. The fourth semiconductor region 14 is of the second conductive type.

As shown in FIGS. 1 and 3, the fifth semiconductor region 15 is provided between the first electrode 51 and the first semiconductor region 11. The fifth semiconductor region 15 is of the first conductive type. A direction from the fourth semiconductor region 14 to the fifth semiconductor region 15 crosses the first direction D1. The direction from the fourth semiconductor region 14 to the fifth semiconductor region 15 is along the X-Y plane.

In one example, one fourth semiconductor region 14 and a plurality of island-shaped fifth semiconductor regions 15 may be provided. The fourth semiconductor region 14 is provided around the plurality of island-shaped fifth semiconductor regions 15. In another example, one fifth semiconductor region 15 and a plurality of island-shaped fourth semiconductor regions 14 may be provided. A fifth semiconductor region 15 is provided around the plurality of island-shaped fourth semiconductor regions 14. In yet another example, a plurality of fourth semiconductor regions 14 and a plurality of fifth semiconductor regions 15 may be provided.

Figure 6:
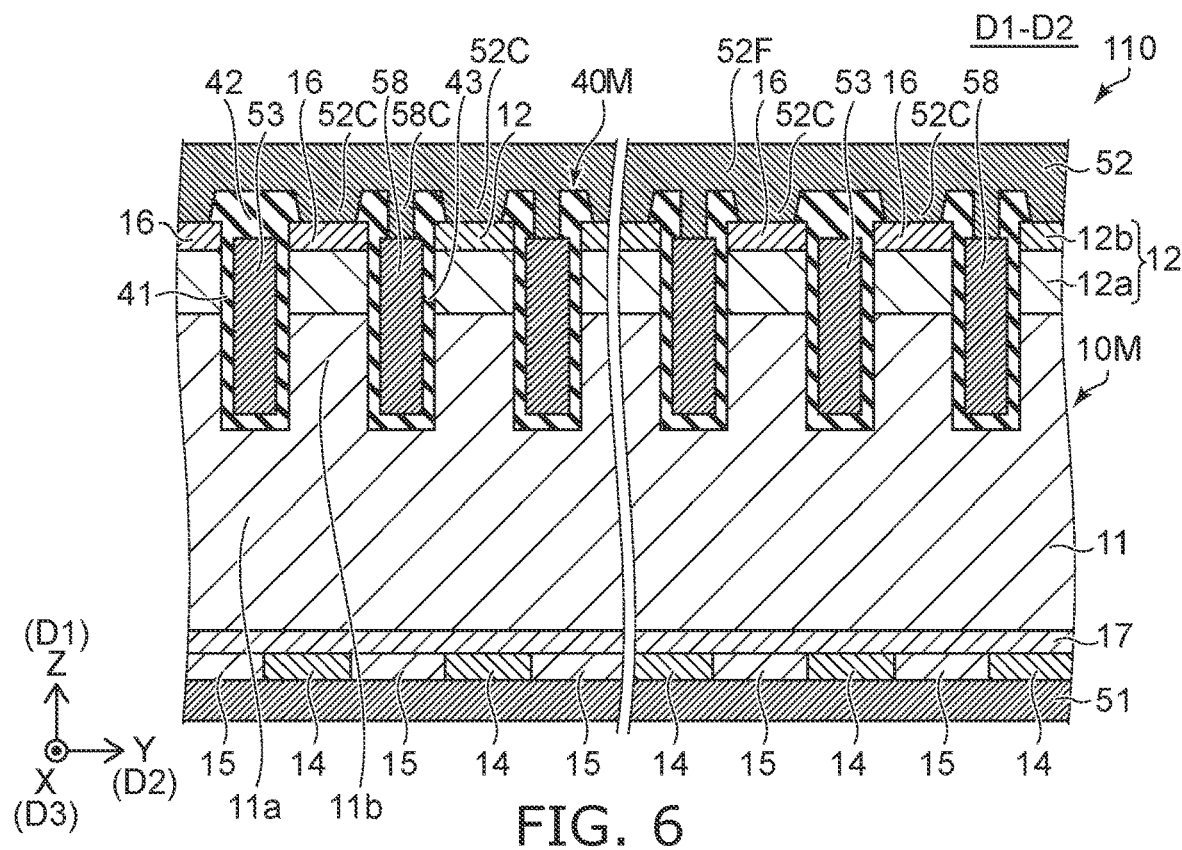
FIG. 6 is a schematic view illustrating the semiconductor device according to the first embodiment.

As shown in FIGS. 6 and 8, the sixth semiconductor region 16 is electrically connected with the second electrode 52. The sixth semiconductor region 16 is of the first conductive type. As shown in FIG. 8, as already described, in this example, the second electrode 52 includes the second electrode planar portion 52F and the second electrode connecting portion 52C. The second electrode connecting portion 52C extends along the third direction D3 (see FIG. 2B). As shown in FIG. 8, a part of the second electrode connecting portion 52C is located between the third semiconductor region 13 and the second electrode planar portion 52F in the first direction D1. Another part of the second electrode connecting portion 52C is between the sixth semiconductor region 16 and the second electrode planar portion 52F in the first direction D1. The second electrode connecting portion 52C electrically connects the third semiconductor region 13 with the second electrode planar portion 52F, and electrically connects the sixth semiconductor region 16 with the second electrode planar portion 52F.

As shown in FIGS. 1, 4 and 6, at least a part of the sixth semiconductor region 16 is located between another part of the second semiconductor region 12 and the first extending portion 61.

As shown in FIG. 3, the insulating member 40M includes a first insulating region 41. The first insulating region 41 is provided between the third electrode 53 and the semiconductor member 10M. The first insulating region 41 electrically insulates the third electrode 53 and the semiconductor member 10M from each other.

As shown in FIG. 3, the insulating member 40M may further include a second insulating region 42. The second insulating region 42 is provided between the third electrode 53 and the second electrode 52 in the first direction D1. The second insulating region 42 electrically connects the third electrode 53 and the second electrode 52 with each other.

In the semiconductor device 110, for example, a first operation can be performed. In the first operation, a current flowing between the first electrode 51 and the second electrode 52 can be controlled by a potential of the third electrode 53. The potential of the third electrode 53 is, for example, a potential based on a potential of the second electrode 52. In the first operation, the current flows in the direction from the first electrode 51 to the second electrode 52. In the semiconductor device 110, a second operation may be performed. In the second operation, the current flows in the direction from the second electrode 52 to the first electrode 51.

The semiconductor device 110 is, for example, an RC-IGBT (Reverse-Conducting Insulated Gate Bipolar Transistor). The first operation corresponds to, for example, an IGBT operation (IGBT mode). The second operation corresponds to, for example, a diode operation (diode mode). The first electrode 51 is, for example, a collector electrode. The second electrode 52 is, for example, an emitter electrode. The third electrode 53 is, for example, a gate electrode. The first operation and the second operation may be repeated.

For example, the second semiconductor region 12 corresponds to a p-type base region. The third semiconductor region 13 corresponds to, for example, an n-type emitter region.

As shown in FIG. 10, the first wiring member 61M includes a pad portion 61P. The pad portion 61P is electrically connected with the first extending portion 61. By controlling the potential of the pad portion 61P, the potential of the third electrode 53 electrically connected with the first extending portion 61 can be controlled. As a result, a switching operation is performed. The region in which the third semiconductor region 13 is provided is, for example, an operating region (for example, a cell region).

As shown in FIG. 1, for example, during recovery in diode operation (reverse operation) (for example, Desert control), the carrier 10C (for example, an electron) moves from the first semiconductor region 11 toward the second electrode 52 through the second semiconductor region 12 and the semiconductor region 13. For example, the carrier 10C is evacuated (pulled out).

In the embodiment, the sixth semiconductor region 16 is provided in a portion overlapping the first extending portion 61. As a result, for example, during recovery in diode operation (reverse operation), the carrier 10C (for example, electrons) can move from the first semiconductor region 11 toward the second electrodes 52 through the second semiconductor region 12 and the sixth semiconductor region 16 (see FIG. 1). As a result, for example, the carrier 10C is evacuated even in the region where the first extending portion 61 is provided. In the embodiment, the carrier can be efficiently evacuated.

Thereby, for example, the reverse recovery current (Irr) can be reduced. For example, a high breakdown strength can be obtained. For example, stable characteristics can be obtained. For example, high reliability can be obtained. According to the embodiment, it is possible to provide a semiconductor device capable of stabilizing the characteristics.

As shown in FIG. 2A, a length of the sixth semiconductor region 16 along the third direction D3 is defined as a sixth semiconductor region length L16. A length of the third semiconductor region 13 along the third direction D3 is defined as a third semiconductor region length L13. In the embodiment, the sixth semiconductor region length L16 is preferably longer than the third semiconductor region length L13. Thereby, for example, the carrier 10C is evacuated more efficiently.

For example, the sixth semiconductor region length L16 is preferably not less than 10 times the third semiconductor region length L13. As a result, the carrier 10C is evacuated more efficiently. The sixth semiconductor region length L16 is preferably not more than 500 times the third semiconductor region length L13. As a result, the semiconductor device can be easily downsized.

The sixth semiconductor region length L16 is not less than 10 μm and not more than 200 μm. The third semiconductor region length L13 is not less than 0.3 μm and not more than 10 μm.

In the embodiment, the sixth semiconductor region length L16 is longer than the length L53 along the second direction D2 of the third electrode 53 (see FIG. 2A). In one example, the length L53 is, for example, not less than 0.3 μm and not more than 1.5 μm.

As shown in FIG. 2B, a length of the first wiring connecting portion 61C along the third direction D3 is defined as a length Lx61. A length of the first wiring connecting portion 61C along the second direction D2 is defined as a length Ly61. The length Lx61 is preferably longer than the length Ly61. As a result, the first wiring connecting portion 61C is electrically connected with the third electrode 53 being narrow in a wide area. For example, it is easy to obtain an electrical connection with low electrical resistance. More stable operation can be obtained.

As shown in FIG. 2A, the semiconductor member 10M may include a plurality of third semiconductor regions 13 and a plurality of sixth semiconductor regions 16. A part of the third electrode 53 is located between one of the plurality of third semiconductor regions 13 and another one of the plurality of third semiconductor regions 13 in the second direction D2. Another part of the third electrode 53 is located between one of the plurality of sixth semiconductor regions 16 and another one of the plurality of sixth semiconductor regions 16 in the second direction D2.

As shown in FIG. 2A, the plurality of third semiconductor regions 13 may be arranged along the third direction D3. For example, a direction from one of the plurality of third semiconductor regions 13 to another one of the plurality of third semiconductor regions 13 is along the third direction D3. At least a part of the second semiconductor region 12 is located between one of the plurality of third semiconductor regions 13 and another one of the plurality of third semiconductor regions 13 in the third direction D3.

As shown in FIG. 2A, a part of the second semiconductor region 12 may be between the sixth semiconductor region 16 and the third semiconductor region 13.

In the embodiment, the impurity concentration of the first conductive type in the sixth semiconductor region 16 may be substantially the same as the impurity concentration of the first conductive type in the third semiconductor region 13. For example, the impurity concentration of the first conductive type in the sixth semiconductor region 16 is preferably not less than 0.5 times and not more than 2 times the impurity concentration of the first conductive type in the third semiconductor region 13. The carrier 10C is evacuate more stably. Manufacture of semiconductor devices becomes easy.

As shown in FIGS. 1 and 3, the semiconductor member 10M may further include a seventh semiconductor region 17 of the first conductive type. The seventh semiconductor region 17 is provided between the fourth semiconductor region 14 and the first semiconductor region 11 and between the fifth semiconductor region 15 and the first semiconductor region 11. The seventh semiconductor region 17 is, for example, a buffer layer. For example, the impurity concentration of the first conductive type in the seventh semiconductor region 17 is higher than the impurity concentration of the first conductive type in the first semiconductor region 11. For example, the carrier concentration of the first conductive type in the seventh semiconductor region 17 is higher than the carrier concentration of the first conductive type in the first semiconductor region 11. The first semiconductor region 11 is, for example, an n region or an n$^+$ region. The seventh semiconductor region 17 is, for example, an n$^+$ region.

As shown in FIG. 3, in the embodiment, for example, at least a part of the third semiconductor region 13, a part of the sixth semiconductor region 16, and the second semiconductor region 12 are in contact with the second electrode 52. A stable electrical connection can be obtained.

As shown in FIG. 2A, the semiconductor device 110 may include a first conductive member 58. The first conductive member 58 extends along the third direction D3. As shown in FIG. 9, a part of the first conductive member 58 is located between a part of the first semiconductor region 11 and the second electrode 52. Another part of the first conductive member 58 is located between another part of the first semiconductor region 11 and the first extending portion 61. The first conductive member 58 is electrically insulated from the first extending portion 61. As shown in FIG. 9, a part of the insulating member 40M is located between the first conductive member 58 and the first extending portion 61. The first conductive member 58 is electrically connected with the second electrode 52. As shown in FIG. 3, a third insulating region 43 of the insulating member 40M is provided between the first conductive member 58 and the semiconductor member 10M.

As shown in FIGS. 2B and 3, the third semiconductor region 13 and the second semiconductor region 12 are located between the third electrode 53 and the first conductive member 58 in the second direction D2.

As shown in FIG. 3, in this example, the second electrode 52 includes a first conductive member connecting portion 58C. As shown in FIG. 2B, the first conductive member connecting portion 58C extends along the third direction D3. As shown in FIG. 3, the first conductive member connecting portion 58C is located between the first conductive member 58 and the second electrode planar portion 52F in the first direction D1. The first conductive member connecting portion 58C electrically connects the first conductive member 58 with the second electrode planar portion 52F.

The first conductive member 58 is, for example, a "dummy gate electrode". A plurality of first conductive members 58 may be provided.

For example, a trench 10T (see FIG. 3) is formed in a semiconductor layer to be the semiconductor member 10M. The trench 10T pierces the third semiconductor region 13 and the second semiconductor region 12 and reaches the first semiconductor region 11. An insulating film serving as the first insulating region 41 is formed inside the trench 10T. A conductive material is filled in a left space of the trench 10T. As a result, the third electrode 53 and the first conductive member 58 are formed.

FIGS. 11A and 11B are circuit diagrams showing a usage example of the semiconductor device according to the first embodiment.

As shown in FIGS. 11A and 11B, a semiconductor device 115 according to the embodiment includes a plurality of elements (first element Q1 and second element Q2, etc.). The semiconductor device 110 above-mentioned can be applied to each of the first element Q1 and the second element Q2.

The first element Q1 includes a first collector C1, a first emitter E1, and a first gate G1. The second element Q2 includes a second collector C2, a second emitter E2, and a second gate G2. The collectors correspond to, for example, the first electrode 51. The emitters correspond to, for example, the second electrode 52. The gates correspond to, for example, the third electrode 53.

For example, the first emitter E1 is electrically connected with the second collector C2. The first emitter E1 is electrically connected with one end of a load LE. A voltage Vdd is applied between the first collector C1 and another end of the load LE. A voltage Vss is applied between another end of the load LE and the second emitter E2. The voltage Vdd and the voltage Vss are supplied by, for example, the power supply 78.

The controller 75 included in the control circuit 70 controls the first gate G1 and the second gate G2. In the state (operation) shown in FIG. 11A, the controller 75 turns on/off the first gate G1. In the state (operation) shown in FIG. 11B, the controller 75 turns on/off the second gate G2.

A semiconductor module 210 according to the embodiment includes a plurality of semiconductor devices (first element Q1 and second element Q2, etc.). The semiconductor module 210 may include the control circuit 70 (controller 75) and the power supply 78.

FIGS. 12A and 12B are schematic diagrams showing a usage example of the semiconductor device according to the first embodiment.

The horizontal axis of FIGS. 12A and 12B is time tm. The vertical axis of FIG. 12A is a voltage VG1 of the first gate G1. The vertical axis of FIG. 12B is a voltage VG2 of the second gate G2.

For example, in the first element Q1 and the second element Q2, the first operation OP1 and the second operation OP2 are performed. In the first operation OP1, the first element Q1 is in the IGBT mode "IM". In the second operation OP2, the first element Q1 is in the OFF state "OFF". In the first operation OP1, the second element Q2 is in the OFF state "OFF". In the second operation OP2, the second element Q2 is in the diode mode "DM".

In the embodiment, the carrier 10C (for example, electrons) can be efficiently evacuated via the third semiconductor region 13 and the sixth semiconductor region 16 before the recovery in the diode mode "DM". Thereby, for example, the reverse recovery current (Irr) can be reduced.

FIGS. 13 to 19 are schematic views illustrating a semiconductor device according to the first embodiment.

Figure 13:
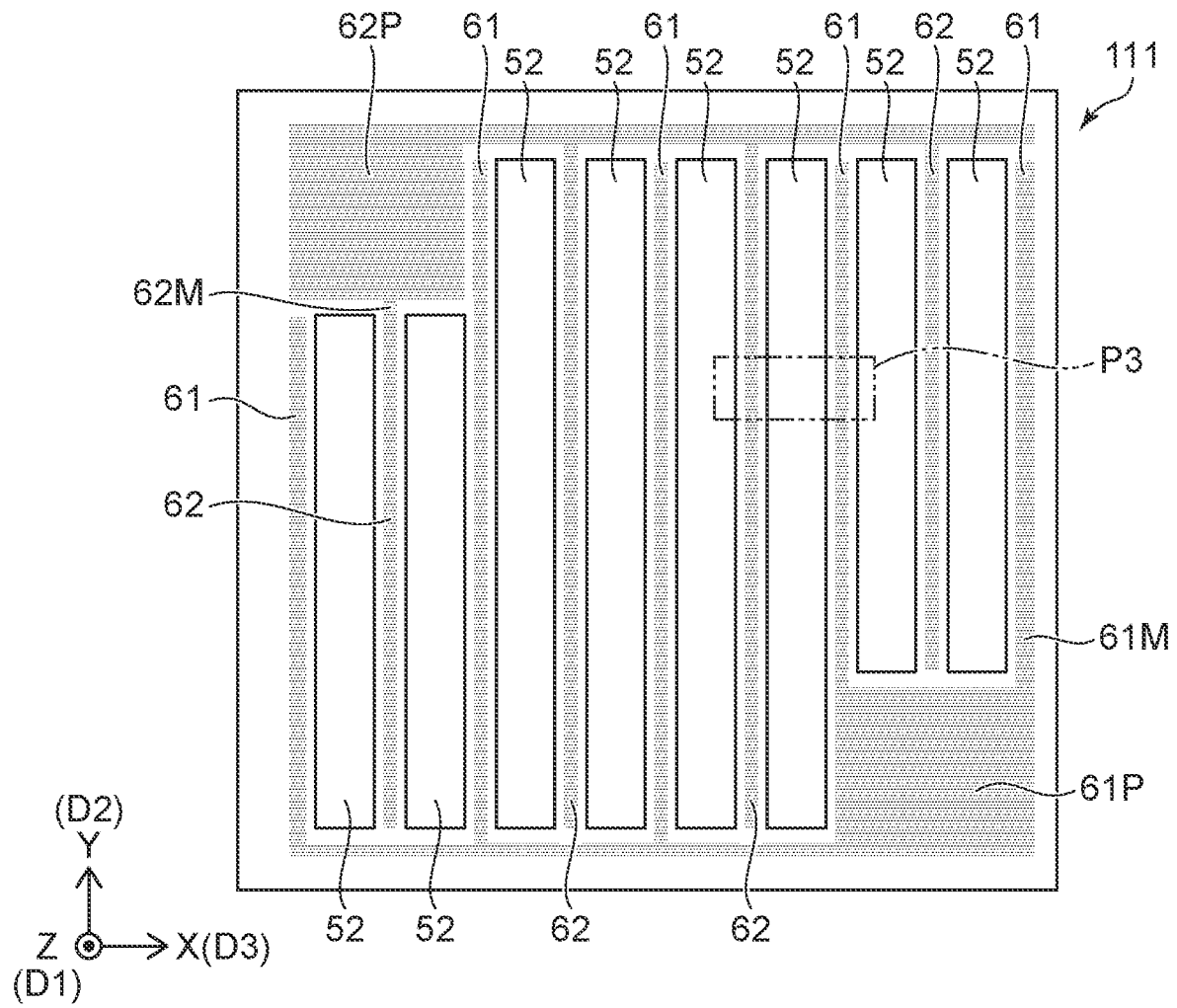
FIG. 13 is a schematic view illustrating a semiconductor device according to the first embodiment.
Figure 14:
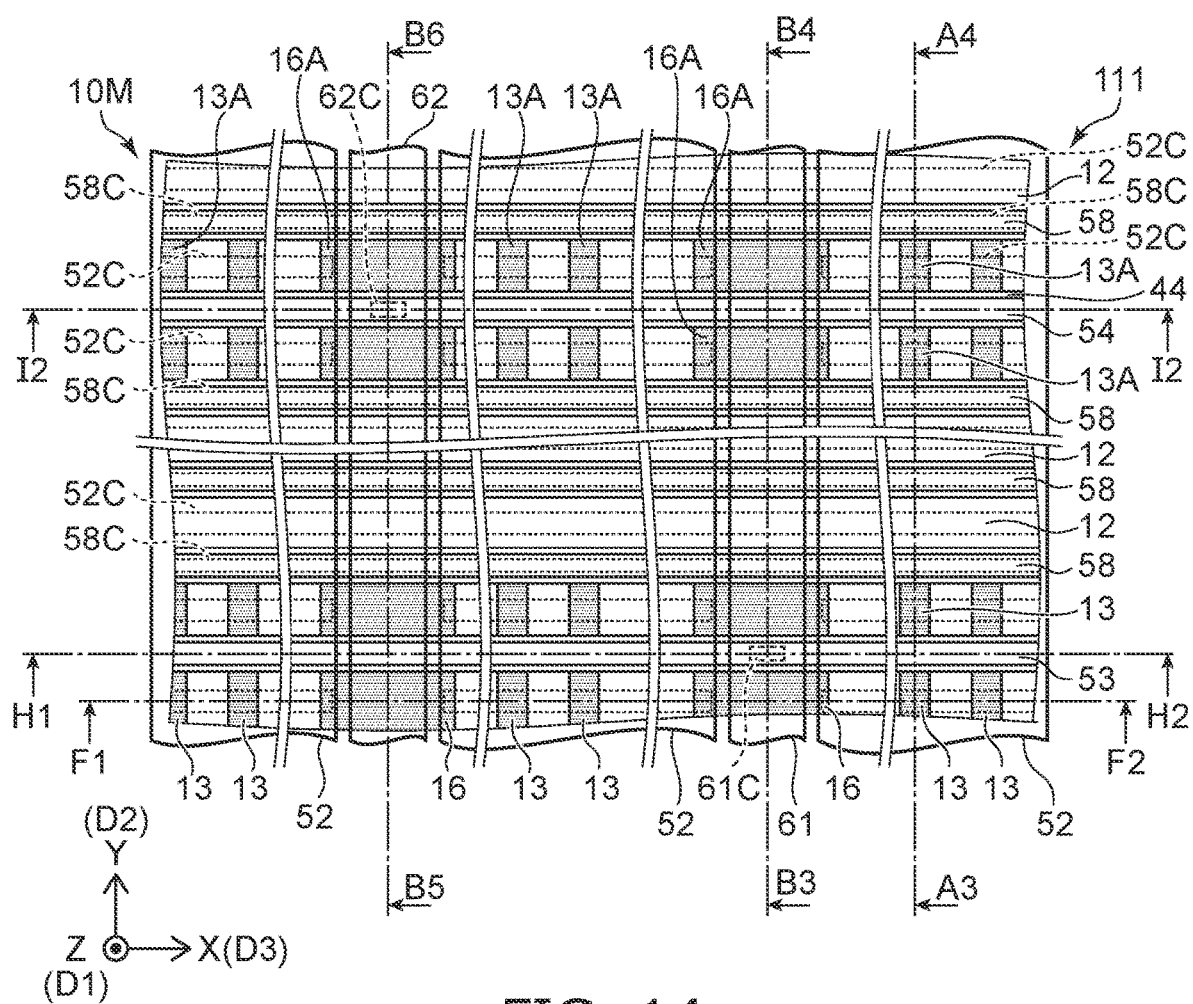
FIG. 14 is a schematic view illustrating the semiconductor device according to the first embodiment.

FIG. 13 is a plan view. FIG. 14 is a transmission plan view of the portion P3 shown in FIG. 13. FIGS. 15 to 19 are cross-sectional views taken along the lines A3-A4, B3-B4, B5-B6, H1-H2, and I1-I2 of FIG. 14, respectively.

As shown in FIG. 13, a semiconductor device 111 according to the embodiment includes a second wiring member 62M. As shown in FIG. 14, the semiconductor device 111 includes a fourth electrode 54. Except for these, the configuration of the semiconductor device 111 may be the same as that of the semiconductor device 110.

As shown in FIG. 13, the second wiring member 62M includes a second extending portion 62. The second extending portion 62 extends along the second direction D2. A direction from the second extending portion 62 to the first extending portion 61 is along the third direction D3. In this example, a plurality of second extending portions 62 are provided. One of the plurality of second extending portions 62 is located between one of the plurality of first extending portions 61 and another one of the plurality of first extending portions 61 in the third direction D3. One of the plurality of first extending portions 61 is between one of the plurality of second extending portions 62 and another one of the plurality of second extending portions 62 in the third direction D3. The second wiring member 62M includes a pad portion 62P. The pad portion 62P is electrically connected with the second extending portion 62.

As shown in FIG. 14, the fourth electrode 54 extends along the third direction D3. The direction from the third electrode 53 to the fourth electrode 54 is along the second direction D2.

Figure 17:
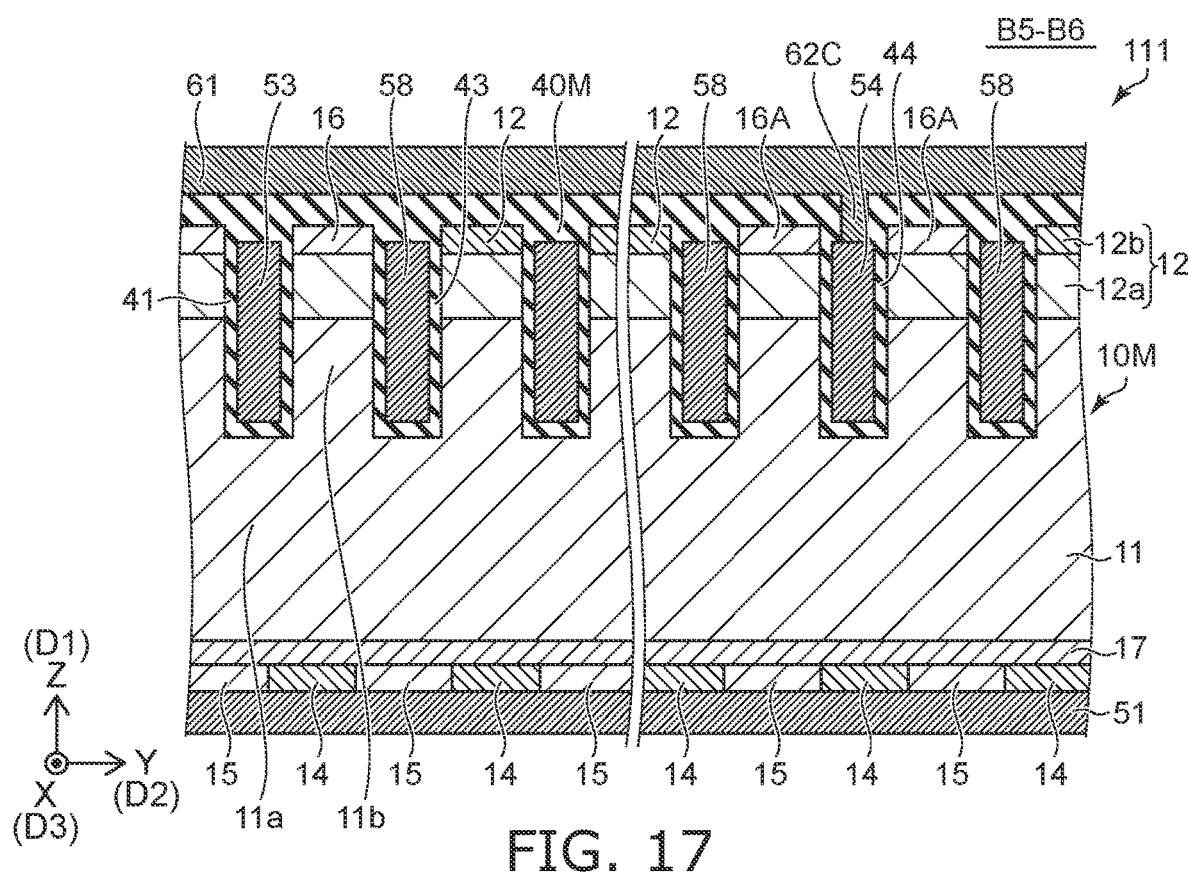
FIG. 17 is a schematic view illustrating the semiconductor device according to the first embodiment.
Figure 18:
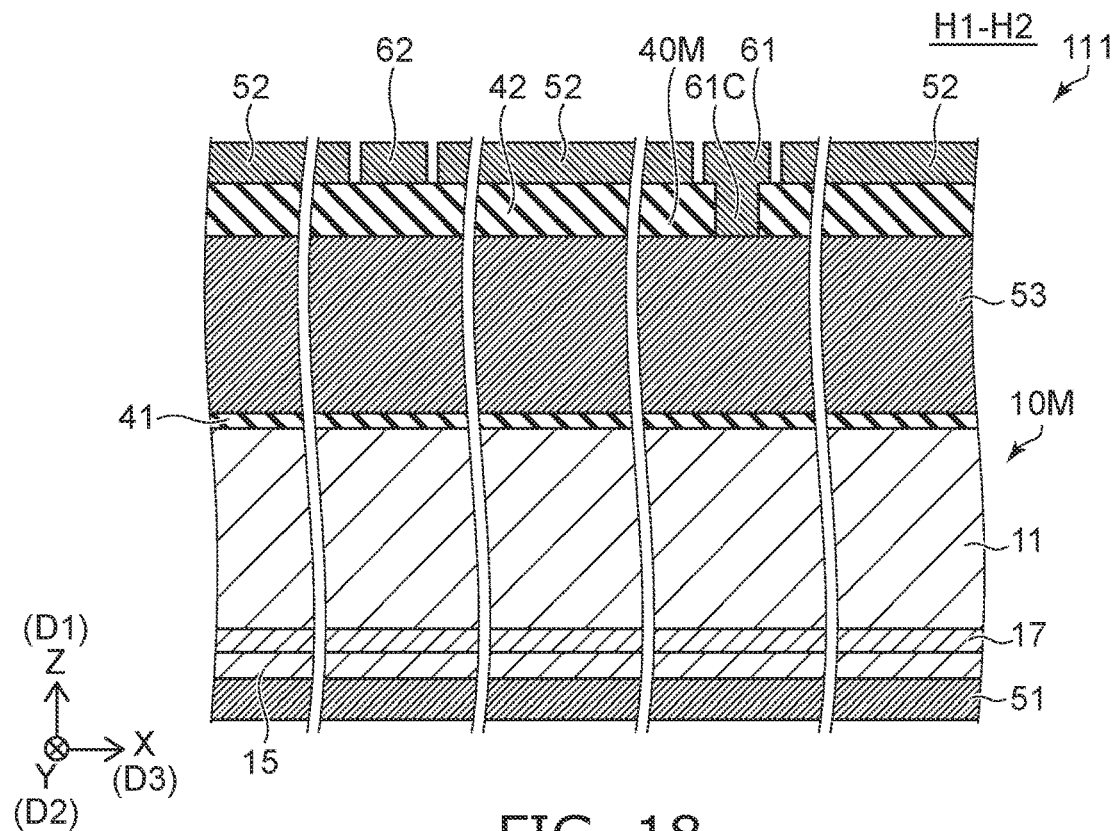
FIG. 18 is a schematic view illustrating the semiconductor device according to the first embodiment.
Figure 19:
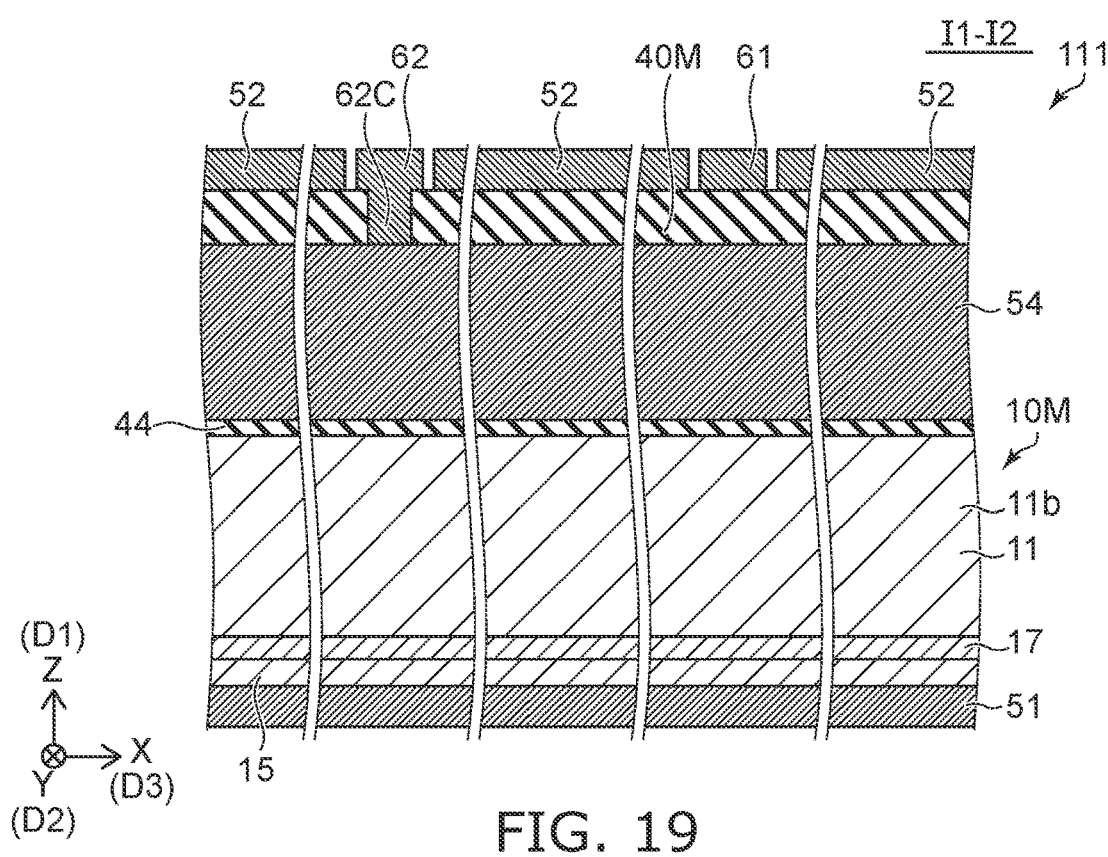
FIG. 19 is a schematic view illustrating the semiconductor device according to the first embodiment.

As shown in FIGS. 17 and 19, a part of the fourth electrode 54 is located between the first electrode 51 and the second extending portion 62. Another part of the fourth electrode 54 is located between the first electrode 51 and the second electrode 52. The fourth electrode 54 is electrically connected with the second extending portion 62.

As shown in FIGS. 17 and 19, in this example, the second wiring member 62M includes a second wiring connecting portion 62C. The second wiring connecting portion 62C is provided between the fourth electrode 54 and the second extending portion 62. The second wiring connecting portion 62C electrically connects the fourth electrode 54 with the second extending portion 62.

As shown in FIG. 14, the semiconductor member 10M includes another third semiconductor region 13A and another sixth semiconductor region 16A in addition to the above-mentioned third semiconductor region 13 and sixth semiconductor region 16.

Figure 15:
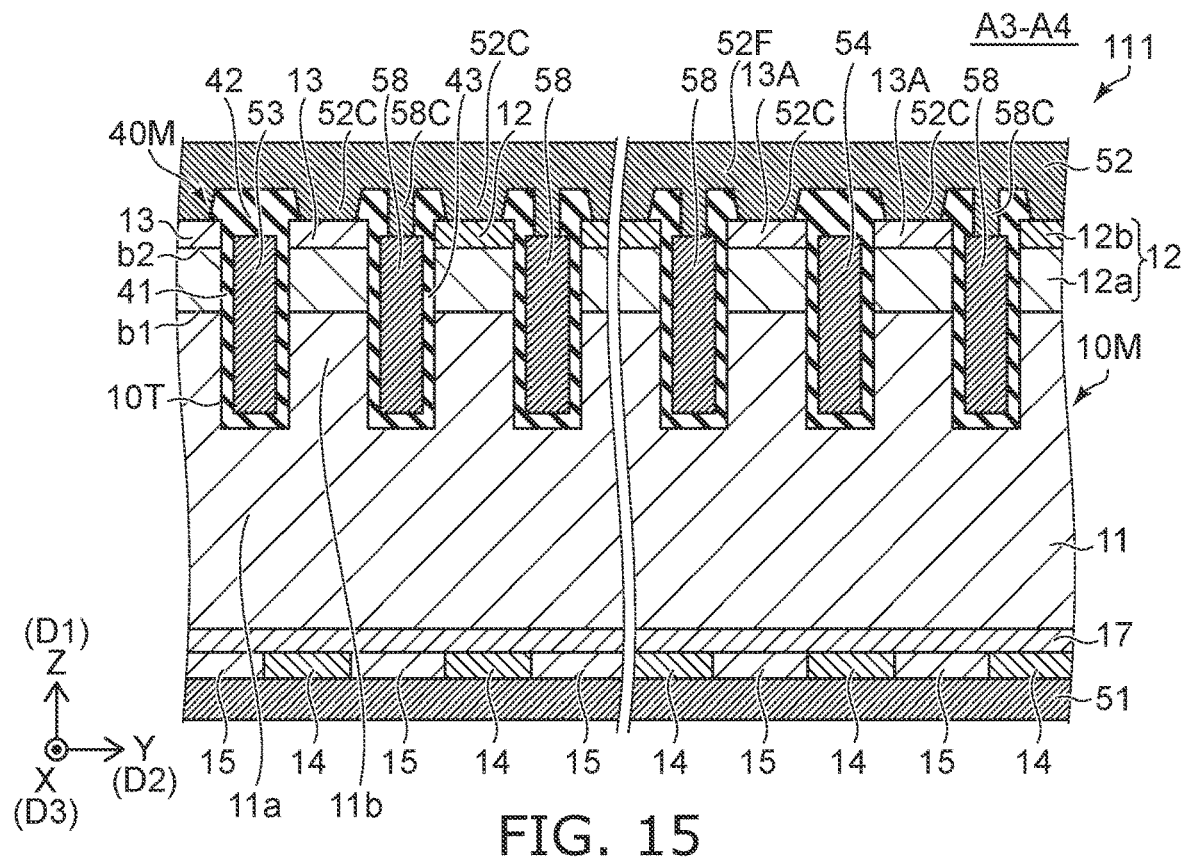
FIG. 15 is a schematic view illustrating the semiconductor device according to the first embodiment.
Figure 16:
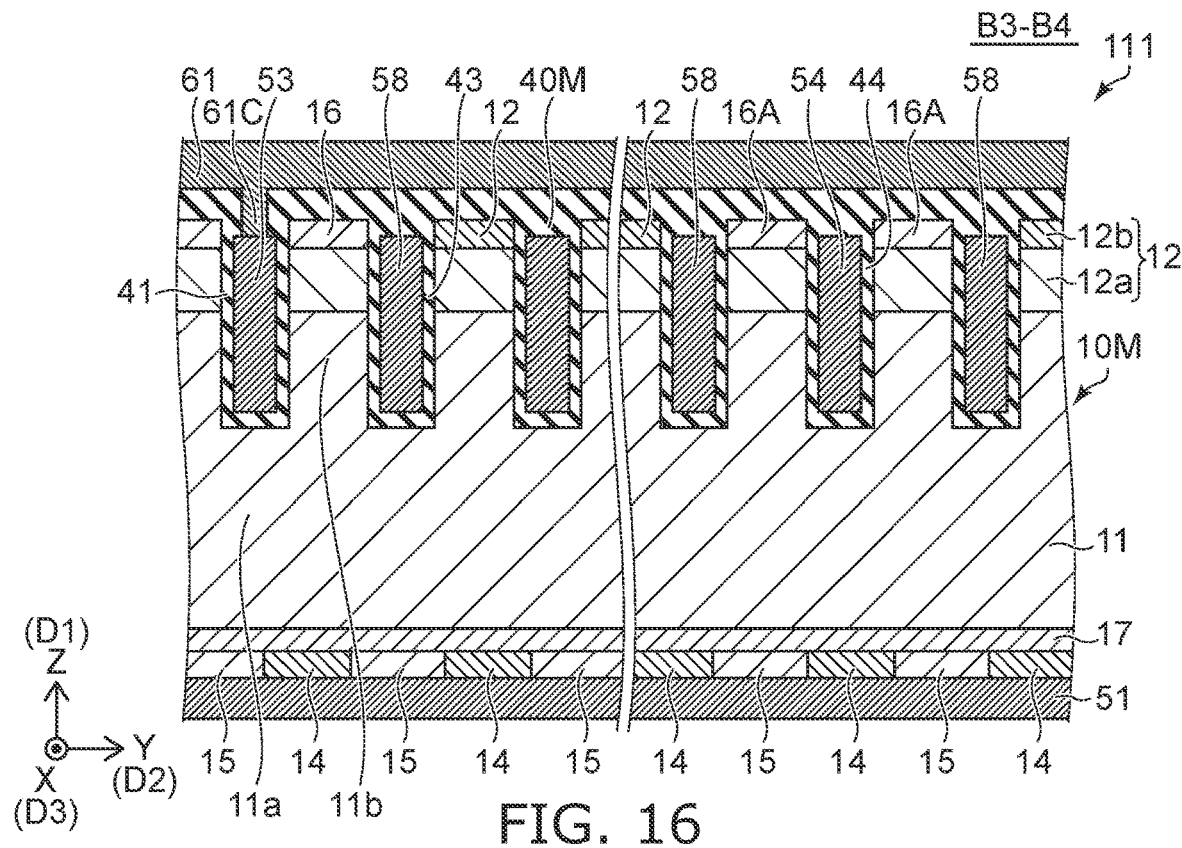
FIG. 16 is a schematic view illustrating the semiconductor device according to the first embodiment.

As shown in FIG. 15, a part of the second semiconductor region 12 is located between the first semiconductor region 11 and the other third semiconductor region 13A in the first direction D1. As shown in FIG. 14, a direction from the fourth electrode 54 to at least a part of the other third semiconductor region 13A is along the second direction D2.

As shown in FIG. 17, at least a part of the other sixth semiconductor region 16A is located between the second semiconductor region 12 and the second extending portion 62.

A part of the insulating member 40M (fourth insulating region 44) is provided between the fourth electrode 54 and the semiconductor member 10M.

For example, a voltage applied to the pad portion 62P is applied to the fourth electrode 54 via the second wiring member 62M. The fourth electrode 54 functions as a gate electrode different from the third electrode 53.

By providing the other sixth semiconductor region 16A in the semiconductor device 111, the carrier 10C is also evacuated in the region where the second extending portion 62 is provided, for example. For example, the reverse recovery current (Irr) can be reduced. For example, a high breakdown strength can be obtained. For example, stable characteristics can be obtained.

In the semiconductor device 111, a voltage (signal) different from the voltage (signal) applied to the third electrode 53 can be applied to the fourth electrode 54. The fourth electrode 54 can be controlled to a state different from that of the third electrode 53. For example, the degree of evacuation (pulling out) of the carrier 10C can be adjusted. More stable operation can be obtained.

The semiconductor module 210 according to the embodiment includes the semiconductor device 111 according to the embodiment and the controller 75 (see FIGS. 11A and 11B). The controller 75 can apply a first signal to the first wiring member 61M. The controller 75 can apply a second signal different from the first signal to the second wiring member 62M.

Second Embodiment

FIGS. 20, 21A, 21B, and 22 to 30 are schematic views illustrating a semiconductor device according to a second embodiment.

Figure 20:
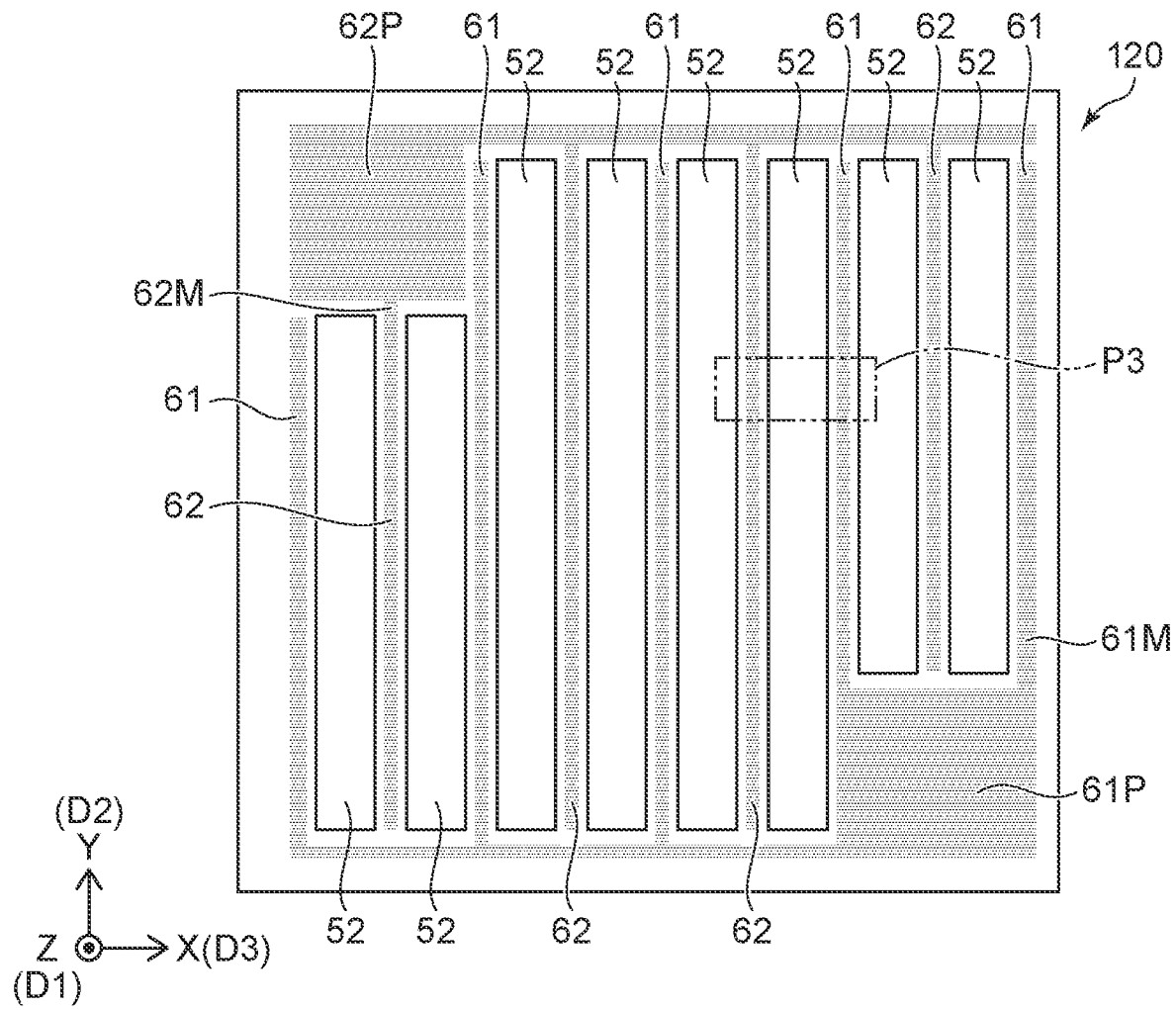
FIG. 20 is a schematic view illustrating a semiconductor device according to the second embodiment.
Figure 21A:
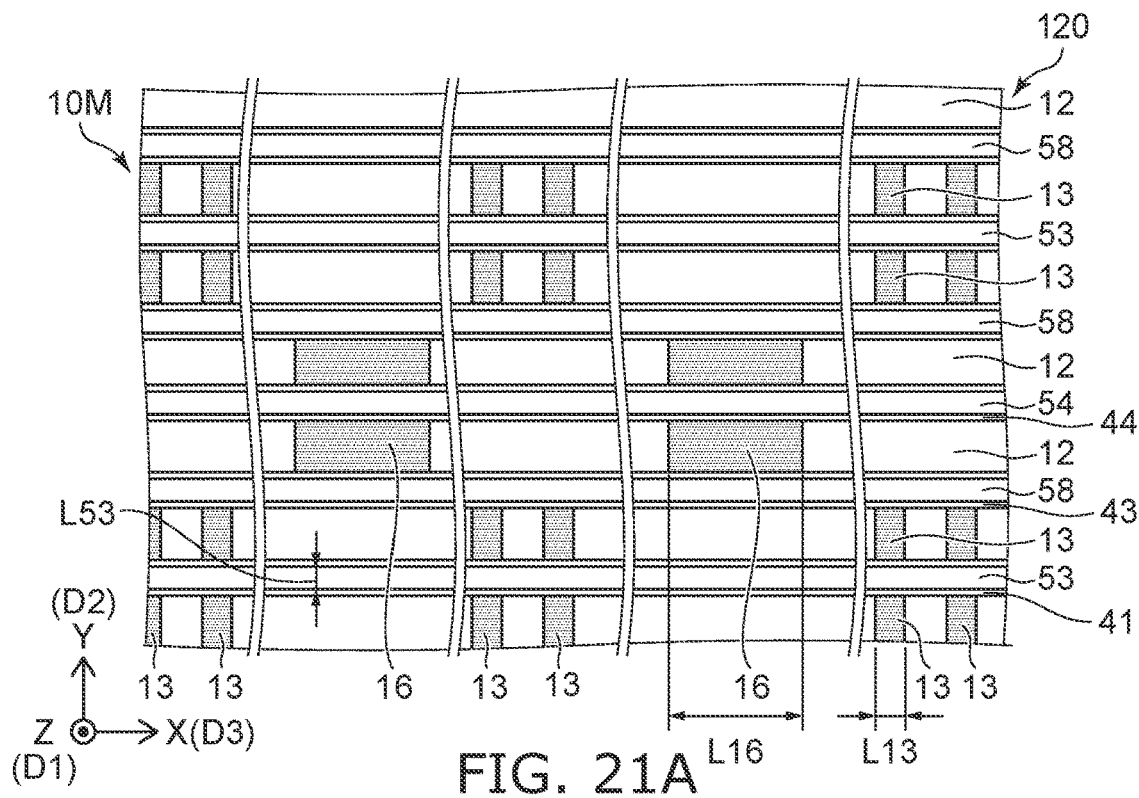
FIGS. 21A and 21B are schematic views illustrating the semiconductor device according to the second embodiment.
Figure 21B:
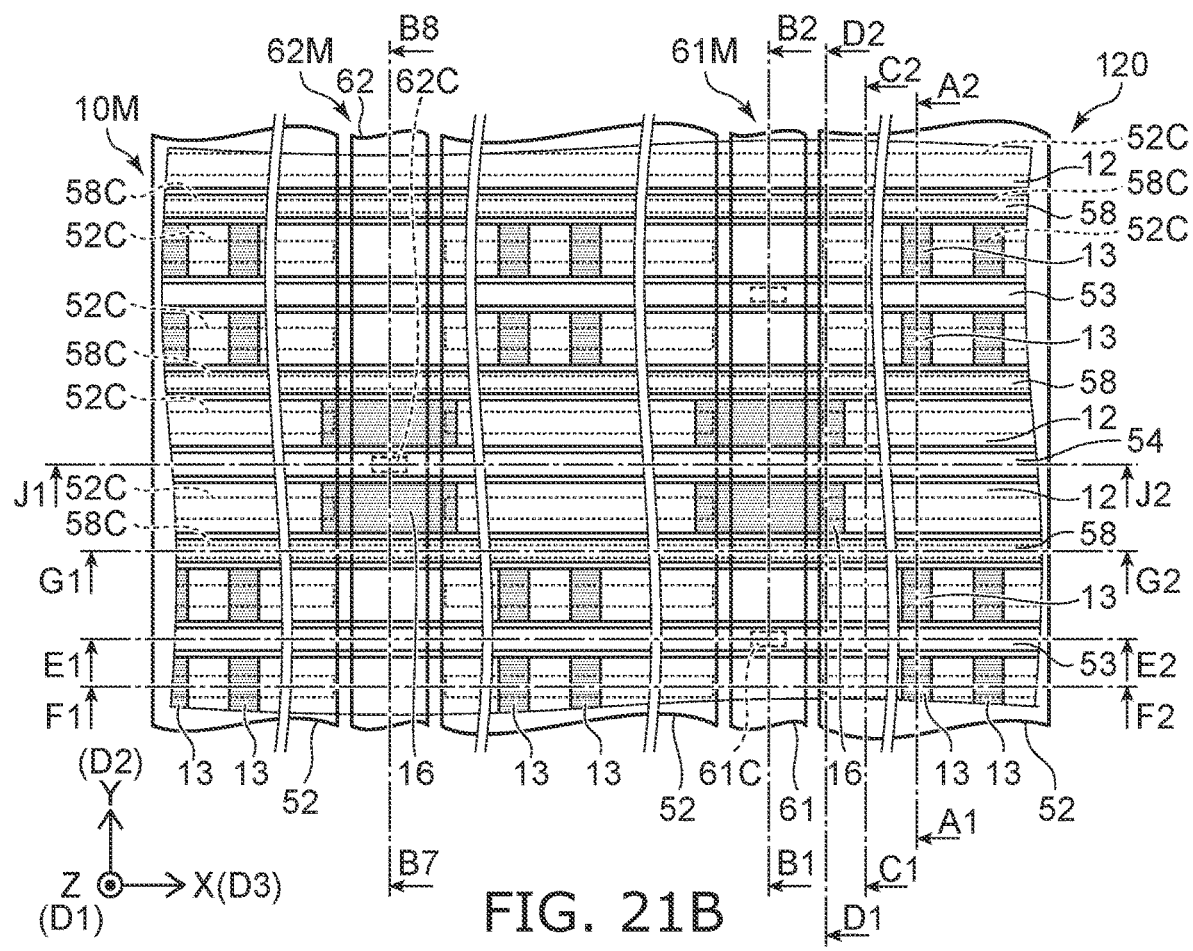

FIG. 20 is a plan view. FIG. 21A is a plan view of the portion P3 shown in FIG. 20. FIG. 21B is a transmission plan view of the portion P3 of FIG. 20. FIGS. 22 to 30 are sectional views on A1-A2 line, B1-B2 line, B7-B8 line, C1-C2 line, D1-D2 line, E1-E2 line, F1-F2 line, G1-G2 line and J1-J2 line, respectively, of FIG. 21B.

Figure 22:
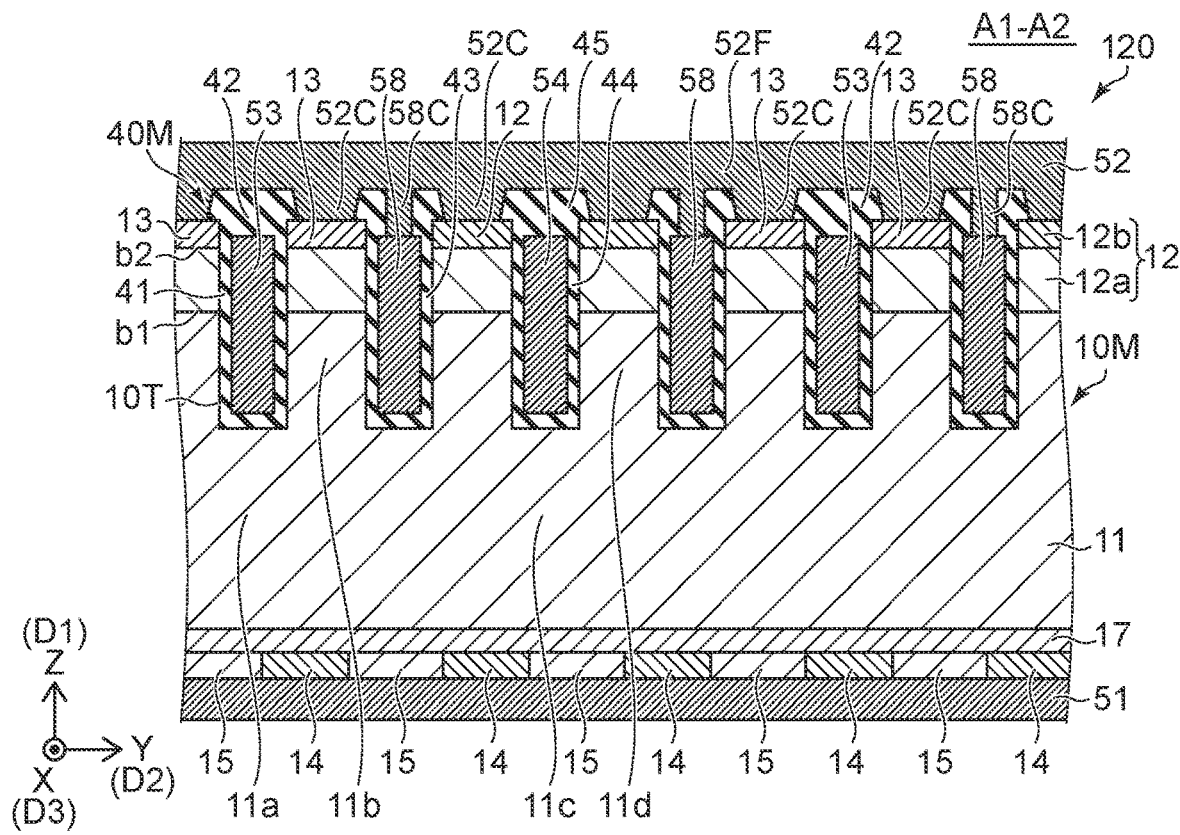
FIG. 22 is a schematic view illustrating the semiconductor device according to the second embodiment.

As shown in FIG. 22, a semiconductor device 120 according to the embodiment includes the first electrode 51. As shown in FIGS. 22 and 20, the semiconductor device 120 includes the second electrode 52, the first wiring member 61M, and the second wiring member 62M. As shown in FIGS. 21B and 22, the semiconductor device 120 includes the third electrode 53, the fourth electrode 54, the semiconductor member 10M, and the insulating member 40M. Also in this example, the direction from the first electrode 51 to the second electrode 52 is along the first direction D1 (see FIG. 22).

As shown in FIG. 21B, the first wiring member 61M includes the first extending portion 61. The first extending portion 61 extends along the second direction D2 crossing the first direction D1. The third direction D3 from the first extending portion 61 to the second electrode 52 crosses the first plane including the first direction D1 and the second direction D2.

The second wiring member 62M includes the second extending portion 62. The second extending portion 62 extends along the second direction D2. The direction from the second extending portion 62 to the second electrode 52 is along the third direction D3.

Figure 24:
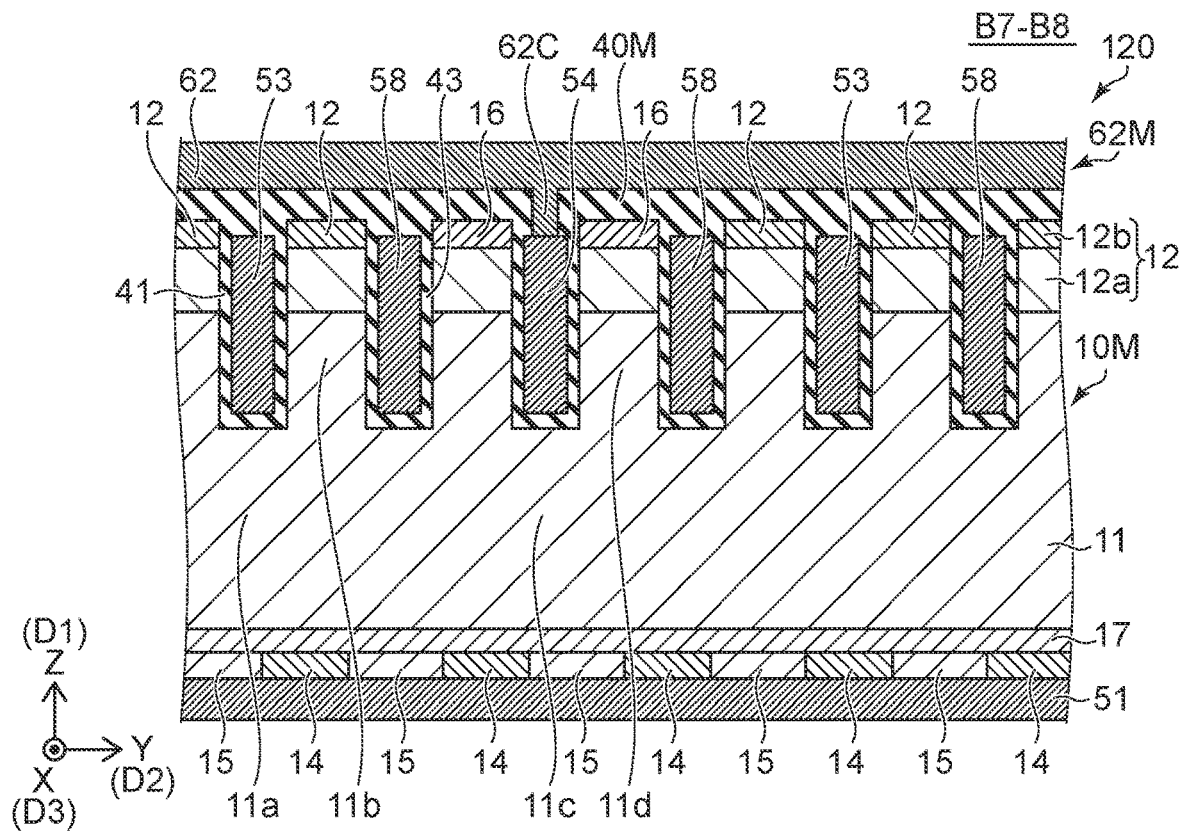
FIG. 24 is a schematic view illustrating the semiconductor device according to the second embodiment.
Figure 25:
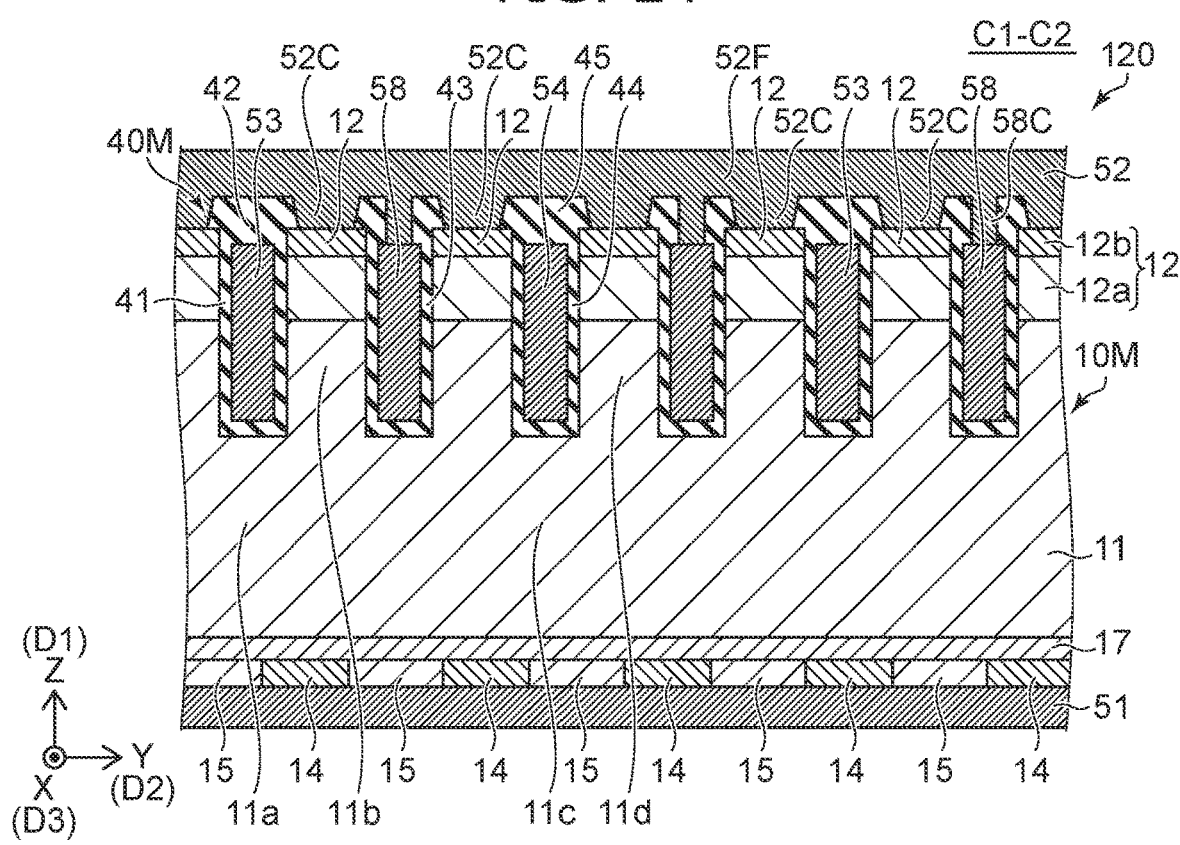
FIG. 25 is a schematic view illustrating the semiconductor device according to the second embodiment.
Figure 27:
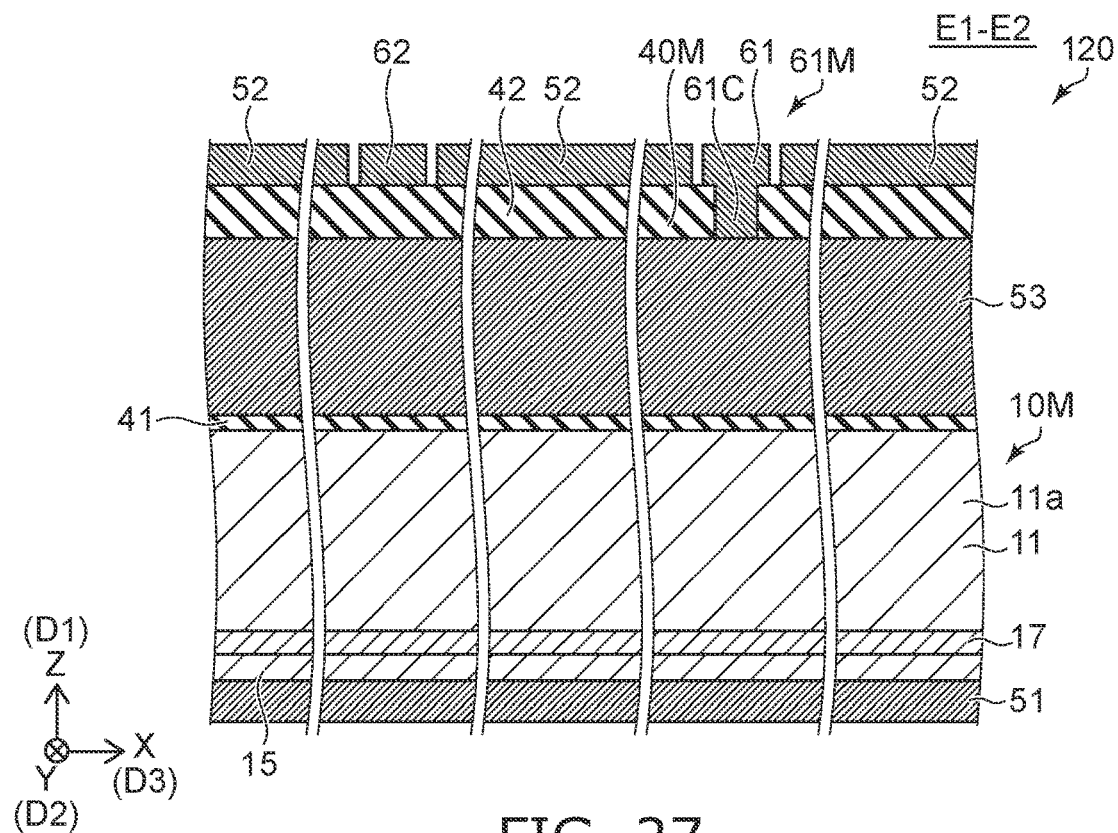
FIG. 27 is a schematic view illustrating the semiconductor device according to the second embodiment.
Figure 28:
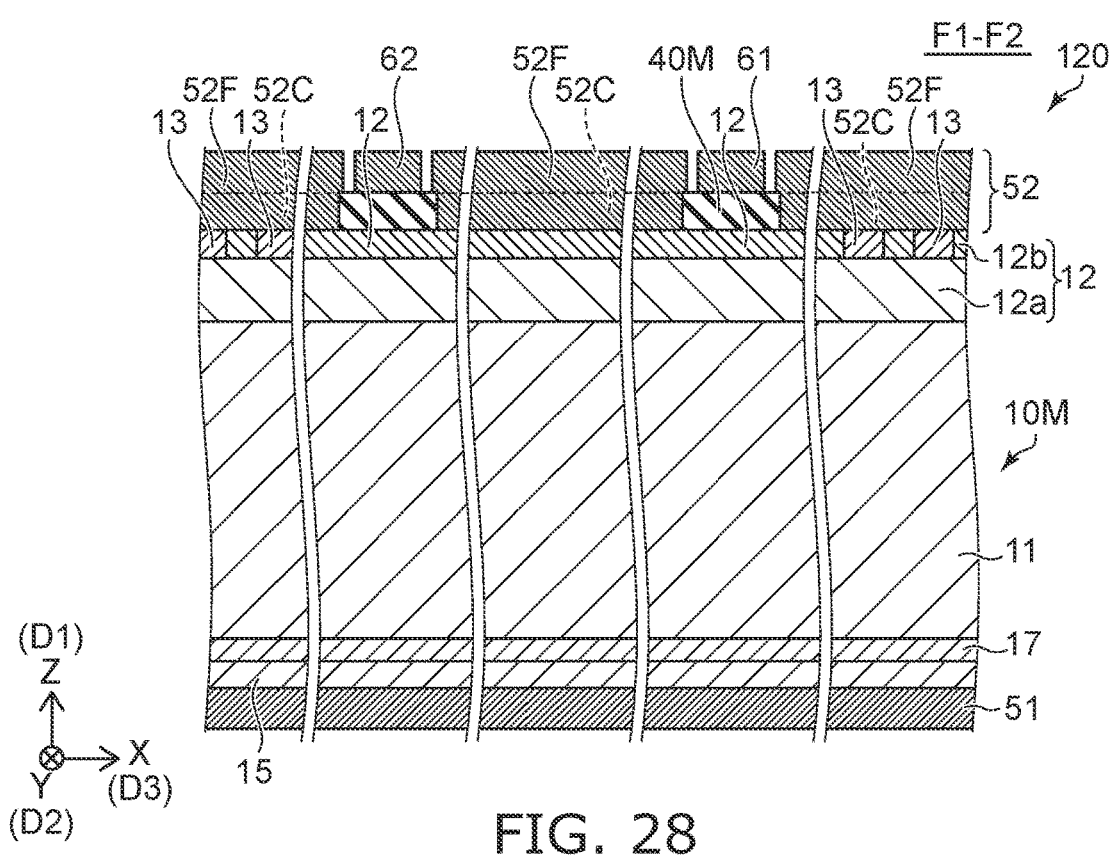
FIG. 28 is a schematic view illustrating the semiconductor device according to the second embodiment.
Figure 29:
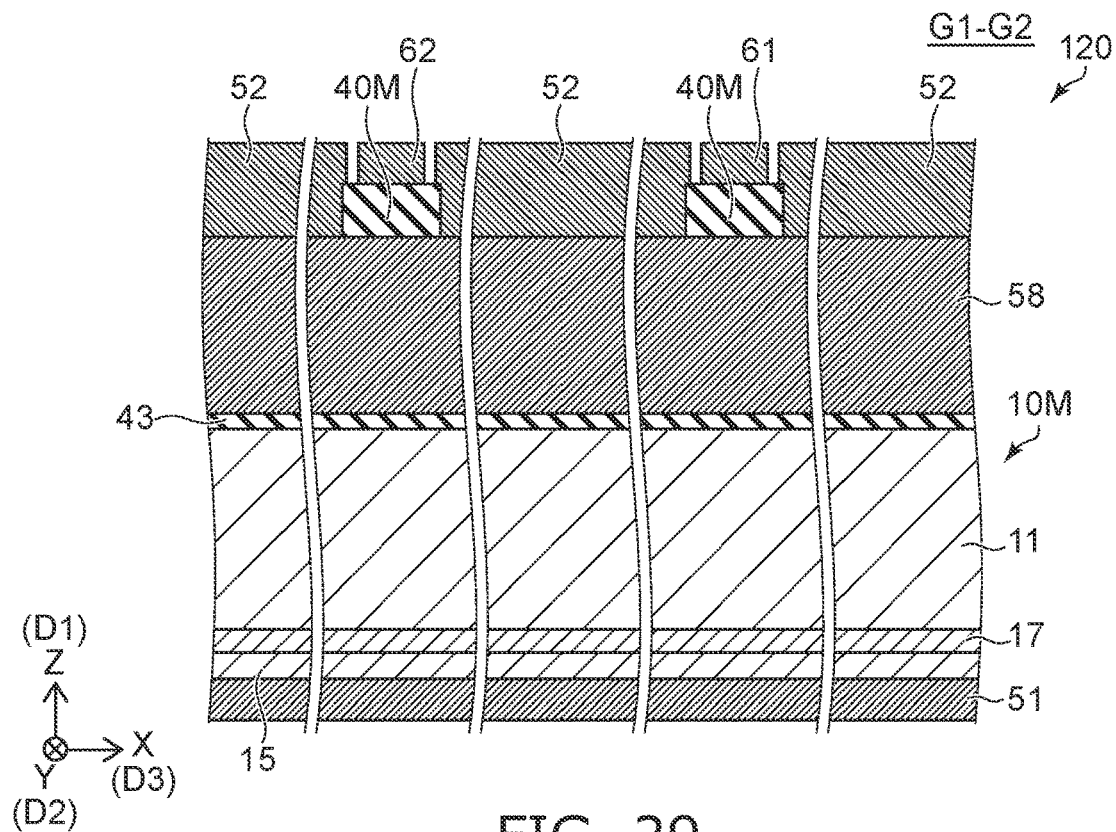
FIG. 29 is a schematic view illustrating the semiconductor device according to the second embodiment.

As shown in FIG. 21B, the third electrode 53 extends along the third direction D3. As shown in FIGS. 22 and 27, a part of the third electrode 53 is located between the first electrode 51 and the first extending portion 61. As shown in FIG. 27, another part of the third electrode 53 is located between the first electrode 51 and the second electrode 52. The third electrode 53 is electrically connected with the first extending portion 61. For example, as shown in FIGS. 22 and 27, the third electrode 53 is electrically connected with the first extending portion 61 by the first wiring connecting portion 61C. As shown in FIG. 24, a part of the third electrode 53 may be provided between the first electrode 51 and the second extending portion 62.

Figure 23:
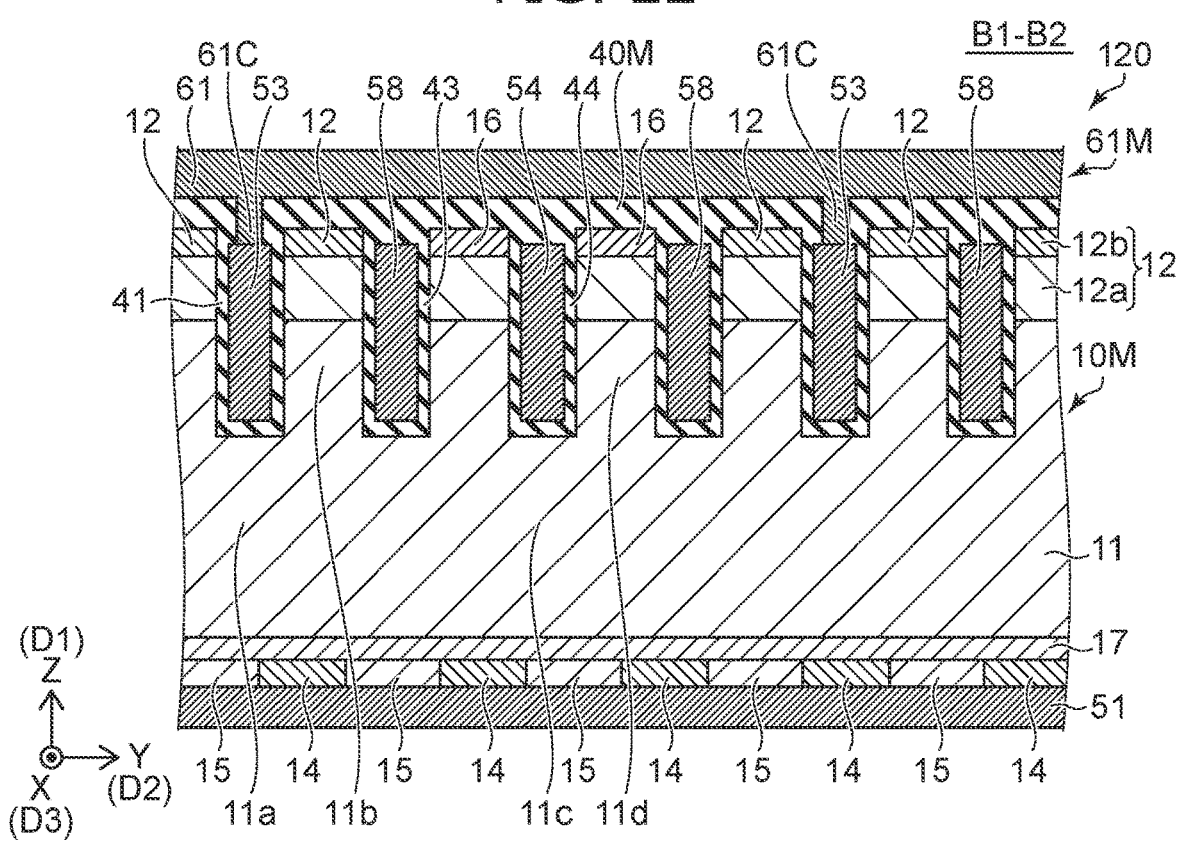
FIG. 23 is a schematic view illustrating the semiconductor device according to the second embodiment.
Figure 30:
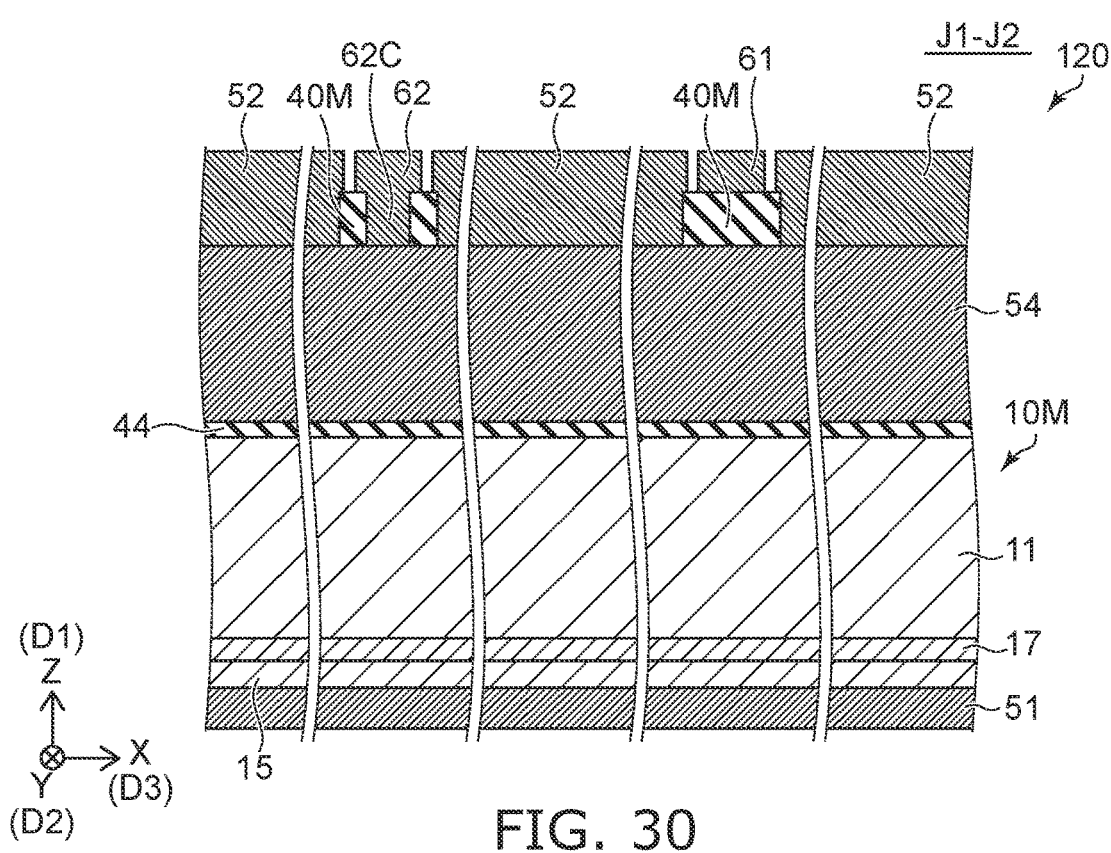
FIG. 30 is a schematic view illustrating the semiconductor device according to the second embodiment.

As shown in FIG. 21B, the fourth electrode 54 extends along the third direction D3. As shown in FIGS. 24 and 30, a part of the fourth electrode 54 is located between the first electrode 51 and the second extending portion 62. As shown in FIG. 30, another part of the fourth electrode 54 is located between the first electrode 51 and the second electrode 52. The fourth electrode 54 is electrically connected with the second extending portion 62. For example, as shown in FIGS. 24 and 30, the fourth electrode 54 is electrically connected with the second extending portion 62 by the second wiring connecting portion 62C. As shown in FIG. 21B, the direction from the third electrode 53 to the fourth electrode 54 is along the second direction D2. As shown in FIG. 23, a part of the fourth electrode 54 may be provided between the first electrode 51 and the first extending portion 61.

As shown in FIGS. 22 to 24, the semiconductor member 10M is provided between the first electrode 51 and the second electrode 52, between the first electrode 51 and the first extending portion 61, and between the first electrode 51 and the second extending portion 62 in the first direction D1.

As shown in FIGS. 21A and 22, the semiconductor member 10M includes the first to sixth semiconductor regions 11 to 16. The first semiconductor region 11 is of the first conductive type. As shown in FIG. 22, the first semiconductor region 11 includes the first partial region 11*a*, the second partial region 11*b*, the third partial region 11*c*, and the fourth partial region 11*d*. The first partial region 11*a* is located between the first electrode 51 and the third electrode 53 in the first direction D1. The direction from the third electrode 53 to the second partial region 11*b* is along the second direction D2. The third partial region 11*c* is located between the first electrode 51 and the fourth electrode 54 in the first direction D1. The direction from the fourth electrode 54 to the fourth partial region 11*d* is along the second direction D2.

As shown in FIG. 22, the second semiconductor region 12 is electrically connected with the second electrode 52. For example, the second semiconductor region 12 is electrically connected with the second electrode 52 by the second electrode connecting portion 52C. The second semiconductor region 12 is of the second conductive type. The direction from the third electrode 53 to the second semiconductor region 12 and the direction from the fourth electrode 54 to the second semiconductor region 12 are along the second direction D2.

As shown in FIG. 22, the third semiconductor region 13 is electrically connected with the second electrode 52. For example, the third semiconductor region 13 is electrically connected with the second electrode 52 by the second electrode connecting portion 52C. The second semiconductor region 12 is of the first conductive type. A part of the second semiconductor region 12 is located between the second partial region 11*b* and the third semiconductor region 13 in the first direction D1. The direction from the third electrode 53 to at least a part of the third semiconductor region 13 is along the second direction D2.

As shown in FIG. 22, the fourth semiconductor region 14 is provided between the first electrode 51 and the first semiconductor region 11. The fourth semiconductor region 14 is of the second conductive type.

As shown in FIG. 22, the fifth semiconductor region 15 is provided between the first electrode 51 and the first semi-conductor region 11. The fifth semiconductor region 15 is of the first conductive type. The direction from the fourth semiconductor region 14 to the fifth semiconductor region 15 crosses the first direction D1.

Figure 26:
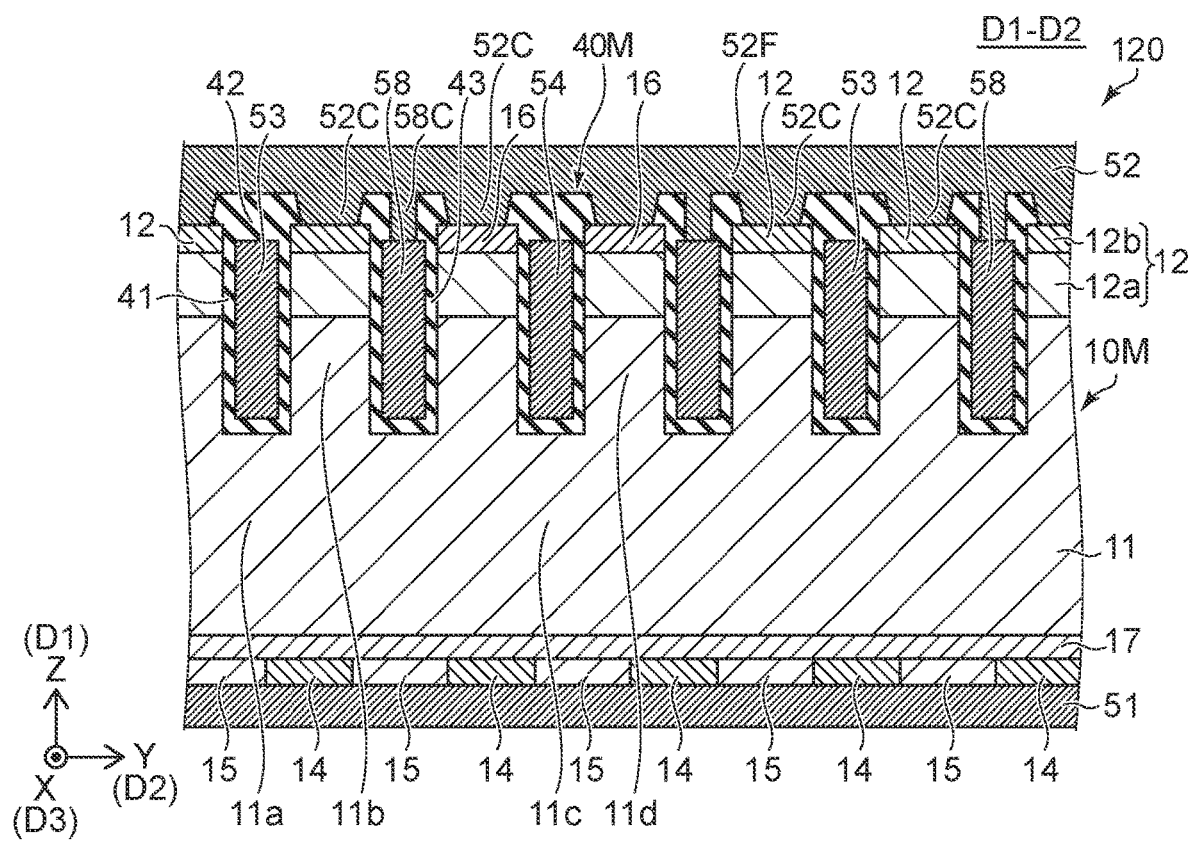
FIG. 26 is a schematic view illustrating the semiconductor device according to the second embodiment.

As shown in FIG. 26, the sixth semiconductor region 16 is electrically connected with the second electrode 52. For example, the sixth semiconductor region 16 is electrically connected with the second electrode 52 by the second electrode connecting portion 52C. The sixth semiconductor region 16 is of the first conductive type. As shown in FIG. 24, at least a part of the sixth semiconductor region 16 is located between another part of the second semiconductor region 12 and the second extending portion 62.

As shown in FIG. 22, at least a part of the insulating member 40M is provided between the third electrode 53 and the semiconductor member 10M, and between the fourth electrode 54 and the semiconductor member 10M. For example, the first insulating region 41 is provided between the third electrode 53 and the semiconductor member 10M. For example, the fourth insulating region 44 is provided between the fourth electrode 54 and the semiconductor member 10M.

For example, the second insulating region 42 of the insulating member 40M is provided between the third electrode 53 and the second electrode 52. For example, a fifth insulating region 45 of the insulating member 40M is provided between the fourth electrode 54 and the second electrode 52.

In the semiconductor device 120, the third electrode 53 is electrically connected with the first extending portion 61, and is electrically connected with, for example, the pad portion 61P. The fourth electrode 54 is electrically connected with the second extending portion 62, and is electrically connected with, for example, the pad portion 62P.

For example, the controller 75 (see FIGS. 11A and 11B) can apply the first signal to the first wiring member 61M. The controller 75 can apply the second signal different from the first signal to the second wiring member 62M. For example, the gate operation by the third electrode 53 and the carrier evacuation operation by the fourth electrode 54 can be controlled and performed.

As shown in FIG. 21B, a direction from the sixth semiconductor region 16 to the third semiconductor region 13 is inclined with respect to the second direction D2 and the third direction D3 in a plane perpendicular to the first direction D1 (the X-Y plane). The sixth semiconductor region 16 does not overlap the third semiconductor region 13 in the third direction D3. The sixth semiconductor region 16 does not overlap the third semiconductor region 13 in the second direction D2.

For example, the sixth semiconductor region 16 is not provided in the region where the third electrode 53 and the first extending portion 61 overlap. The third electrode 53 is provided between the two third semiconductor regions 13 in the second direction D2.

For example, the sixth semiconductor region 16 is provided in a region where the fourth electrode 54 and the second extending portion 62 overlap. The fourth electrode 54 is provided between the two sixth semiconductor regions 16 in the second direction D2.

In the semiconductor device 120, the configuration described for the semiconductor device 110 can be applied.

For example, in the semiconductor device 120, the sixth semiconductor region length L16 is preferably longer than the third semiconductor region length L13 (see FIG. 21A). Thereby, for example, the carrier 10C is evacuated more efficiently.

In the first and second embodiments, the semiconductor member 10M includes, for example, silicon. The semiconductor member 10M may include, for example, a compound semiconductor or the like. The first electrode 51 includes, for example, aluminum. The second electrode 52 includes, for example, aluminum. At least one of the third electrode 53, the fourth electrode 54, and the first conductive member 58 includes, for example, conductive silicon. The insulating member 40M includes, for example, silicon oxide, silicon nitride, silicon nitriding, aluminum oxide and the like.

In the embodiment, information on the shape of the semiconductor region and the like can be obtained by, for example, electron microscope observation. Information on the impurity concentration in the semiconductor region can be obtained by, for example, EDX (Energy Dispersive X-ray Spectroscopy) or SIMS (Secondary Ion Mass Spectrometry). Information on the carrier concentration in the semiconductor region can be obtained by, for example, SCM (Scanning Capacitance Microscopy).

According to the embodiment, it is possible to provide a semiconductor device and a semiconductor module capable of stabilizing characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, wiring members, semiconductor members, semiconductor regions, conductive members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and all semiconductor modules practicable by an appropriate design modification by one skilled in the art based on the semiconductor devices and semiconductor modules described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode to the second electrode being along a first direction;
a first wiring member including a first extending portion, the first extending portion extending along a second direction crossing the first direction, a third direction from the first extending portion to the second electrode crossing a first plane including the first direction and the second direction;
a third electrode extending along the third direction, a part of the third electrode being located between the first electrode and the first extending portion, an other part of the third electrode being located between the first electrode and the second electrode, the third electrode being electrically connected with the first extending portion;
a semiconductor member provided between the first electrode and the second electrode and between the first electrode and the first extending portion in the first direction, the semiconductor member including:
a first semiconductor region of a first conductive type, the first semiconductor region including a first partial region and a second partial region, the first partial region being located between the first electrode and the third electrode in the first direction, a direction from the third electrode to the second partial region being along the second direction;
a second semiconductor region of a second conductive type electrically connected with the second electrode, a direction from the third electrode to the second semiconductor region being along the second direction;
a third semiconductor region of first conductive type electrically connected with the second electrode, a part of the second semiconductor region being located between the second partial region and the third semiconductor region in the first direction, a direction from the third electrode to at least a part of the third semiconductor region being along the second direction;
a fourth semiconductor region of the second conductive type provided between the first electrode and the first semiconductor region;
a fifth semiconductor region of the first conductive type provided between the first electrode and the first semiconductor region, a direction from the fourth semiconductor region to the fifth semiconductor region crossing the first direction; and
a sixth semiconductor region of the first conductive type electrically connected with the second electrode, at least a part of the sixth semiconductor region being between an other part of the second semiconductor region and the first extending portion; and
an insulating member including the first insulating region, the first insulating region being provided between the third electrode and the semiconductor member, wherein
a sixth semiconductor region length along the third direction of the sixth semiconductor region is longer than a third semiconductor region length along the third direction of the third semiconductor region.

2. The device according to claim 1, wherein the sixth semiconductor region length is not less than 10 times and not more than 500 times the third semiconductor region length.

3. The device according to claim 1, wherein the sixth semiconductor region length is longer than a length of the third electrode along the second direction.

4. The device according to claim 1, wherein
the first wiring member further includes a first wiring connecting portion, the first wiring connecting portion is provided between the third electrode and the first extending portion, and the first wiring connecting portion electrically connects the third electrode with the first extension portion.

5. The device according to claim 4, wherein a length of the first wiring connecting portion along the third direction is longer than a length of the first wiring connecting portion along the second direction.

6. The device according to claim 1, wherein
the second electrode includes a second electrode planar portion and a second electrode connecting portion,
the second electrode connecting portion extends along the third direction,
a part of the second electrode connecting portion is located between the second semiconductor region and the second electrode planar portion in the first direction, and
the second electrode connecting portion electrically connects the second semiconductor region with the second electrode planar portion.

7. The device according to claim 1, wherein
the second electrode includes a second electrode planar portion and a second electrode connecting portion,
the second electrode connecting portion extends along the third direction,
a part of the second electrode connecting portion is located between the third semiconductor region and the second electrode planar portion in the first direction,
an other part of the second electrode connecting portion is located between the sixth semiconductor region and the second electrode planar portion in the first direction, and
the second electrode connecting portion electrically connects the third semiconductor region with the second electrode planar portion and electrically connects the sixth semiconductor region with the second electrode planar portion.

8. The device according to claim 1, wherein a part of the second semiconductor region is located between the sixth semiconductor region and the third semiconductor region.

9. The device according to claim 1, wherein an impurity concentration of the first conductive type in the sixth semiconductor region is not less than 0.5 times and not more than 2 times an impurity concentration of the first conductive type in the third semiconductor region.

10. The device according to claim 1, wherein
the semiconductor member further includes a seventh semiconductor region of the first conductive type,
the seventh semiconductor region is provided between the fourth semiconductor region and the first semiconductor region, and between the fifth semiconductor region and the first semiconductor region, and
an impurity concentration of the first conductive type in the seventh semiconductor region is higher than an impurity concentration of the first conductive type in the first semiconductor region.

11. The device according to claim 1, wherein
the semiconductor member includes a plurality of the third semiconductor regions and a plurality of the sixth semiconductor regions,
the part of the third electrode is located between one of the third semiconductor regions and an other one of the third semiconductor regions in the second direction, and an other part of the third electrode is located between the one of the sixth semiconductor regions and an other one of the sixth semiconductor regions in the second direction.

12. The device according to claim 1, wherein
the semiconductor member includes a plurality of the third semiconductor regions,
a direction from one of the third semiconductor regions to an other of the third semiconductor regions is along the third direction, and
at least a part of the second semiconductor region is located between the one of the third semiconductor regions and the other one of the third semiconductor regions in the third direction.

13. The device according to claim 1, wherein
the insulating member further includes a second insulating region, and
the second insulating region is provided between the third electrode and the second electrode in the first direction.

14. The device according to claim 1, further comprising a first conductive member extending along the third direction,
a part of the first conductive member being located between a part of the first semiconductor region and the second electrode,
an other part of the first conductive member being located between an other part of the first semiconductor region and the first extending portion,
the first conductive member being electrically insulated from the first extending portion and electrically connected with the second electrode, and
the third semiconductor region and the second semiconductor region being located between the third electrode and the first conductive member in the second direction.

15. The device according to claim 14, wherein
the second electrode further includes a second electrode planar portion and a first conductive member connecting portion,
the first conductive member connecting portion extends along the third direction,
the first conductive member connecting portion is located between the first conductive member and the second electrode planar portion in the first direction, and
the first conductive member connecting portion electrically connects the first conductive member with the second electrode planar portion.

16. The device according to claim 1, wherein at least a part of the third semiconductor region, a part of the sixth semiconductor region, and the second semiconductor region are in contact with the second electrode.

17. A semiconductor device, comprising:
a first electrode;
a second electrode, a direction from the first electrode to the second electrode being along a first direction;
a first wiring member including a first extending portion, the first extending portion extending along a second direction crossing the first direction, a third direction from the first extending portion to the second electrode crossing a first plane including the first direction and the second direction;
a third electrode extending along the third direction, a part of the third electrode being located between the first electrode and the first extending portion, an other part of the third electrode being located between the first electrode and the second electrode, the third electrode being electrically connected with the first extending portion;

a semiconductor member provided between the first electrode and the second electrode and between the first electrode and the first extending portion in the first direction, the semiconductor member including:
  a first semiconductor region of a first conductive type, the first semiconductor region including a first partial region and a second partial region, the first partial region being located between the first electrode and the third electrode in the first direction, a direction from the third electrode to the second partial region being along the second direction;
  a second semiconductor region of a second conductive type electrically connected with the second electrode, a direction from the third electrode to the second semiconductor region being along the second direction;
  a third semiconductor region of first conductive type electrically connected with the second electrode, a part of the second semiconductor region being located between the second partial region and the third semiconductor region in the first direction, a direction from the third electrode to at least a part of the third semiconductor region being along the second direction;
  a fourth semiconductor region of the second conductive type provided between the first electrode and the first semiconductor region;
  a fifth semiconductor region of the first conductive type provided between the first electrode and the first semiconductor region, a direction from the fourth semiconductor region to the fifth semiconductor region crossing the first direction; and
  a sixth semiconductor region of the first conductive type electrically connected with the second electrode, at least a part of the sixth semiconductor region being between an other part of the second semiconductor region and the first extending portion; and
an insulating member including the first insulating region, the first insulating region being provided between the third electrode and the semiconductor member, wherein
the semiconductor member includes a plurality of the third semiconductor regions,
a direction from one of the third semiconductor regions to an other of the third semiconductor regions is along the third direction, and
at least a part of the second semiconductor region is located between the one of the third semiconductor regions and the other one of the third semiconductor regions in the third direction.

* * * * *